(12) United States Patent
Nakanishi et al.

(10) Patent No.: US 8,698,578 B2
(45) Date of Patent: Apr. 15, 2014

(54) ACOUSTIC WAVE RESONATOR AND DUPLEXER USING SAME

(75) Inventors: Hidekazu Nakanishi, Osaka (JP); Hiroyuki Nakamura, Osaka (JP); Tetsuya Tsurunari, Osaka (JP); Rei Goto, Osaka (JP); Joji Fujiwara, Osaka (JP)

(73) Assignee: Panasonic Corporation, Osaka (JP)

( * ) Notice: Subject to any disclaimer, the term of this patent is extended or adjusted under 35 U.S.C. 154(b) by 350 days.

(21) Appl. No.: 13/319,140

(22) PCT Filed: May 24, 2010

(86) PCT No.: PCT/JP2010/003459
§ 371 (c)(1),
(2), (4) Date: Nov. 7, 2011

(87) PCT Pub. No.: WO2010/137279
PCT Pub. Date: Dec. 2, 2010

(65) Prior Publication Data
US 2012/0044027 A1    Feb. 23, 2012

(30) Foreign Application Priority Data

May 27, 2009   (JP) ................................. 2009-127346
Mar. 4, 2010   (JP) ................................. 2010-047432

(51) Int. Cl.
*H03H 9/00*      (2006.01)
*H03H 9/64*      (2006.01)

(52) U.S. Cl.
USPC .......................................... 333/133; 333/196

(58) Field of Classification Search
USPC ............................ 333/133, 193, 194, 195, 196
See application file for complete search history.

(56) References Cited

U.S. PATENT DOCUMENTS

| | | | | |
|---|---|---|---|---|
| 7,812,688 B2* | 10/2010 | Nakamura et al. | ............ | 333/133 |
| 7,821,179 B2* | 10/2010 | Nakao et al. | ............ | 310/313 C |
| 7,965,155 B2* | 6/2011 | Nakamura et al. | ............ | 333/133 |
| 2004/0174233 A1 | 9/2004 | Takayama et al. | | |
| 2007/0241840 A1 | 10/2007 | Takayama et al. | | |
| 2010/0097161 A1 | 4/2010 | Nakamura et al. | | |

FOREIGN PATENT DOCUMENTS

| | | |
|---|---|---|
| EP | 1 962 424 | 8/2008 |
| JP | 8-316781 | 11/1996 |
| WO | 03/088483 | 10/2003 |
| WO | 2006/003933 | 1/2006 |
| WO | 2008/059780 | 5/2008 |
| WO | 2008/078573 | 7/2008 |

OTHER PUBLICATIONS

International Search Report issued Aug. 17, 2010 in International (PCT) Application No. PCT/JP2010/003459.

* cited by examiner

*Primary Examiner* — Dean O Takaoka
(74) *Attorney, Agent, or Firm* — Wenderoth, Lind & Ponack, LLP.

(57) ABSTRACT

An acoustic wave resonator includes a piezoelectric body, an IDT electrode for exciting an acoustic wave with wavelength λ, and a dielectric thin film provided so as to cover the IDT electrode. The IDT electrode includes a bus bar electrode region, a dummy electrode region, and an IDT cross region in order from outside. The film thickness of the dielectric thin film above at least one of the bus bar electrode region and the dummy electrode region is smaller than that above the IDT cross region by 0.1λ to 0.25λ. This configuration provides an acoustic wave resonator that reduces transverse-mode spurious emission.

26 Claims, 25 Drawing Sheets

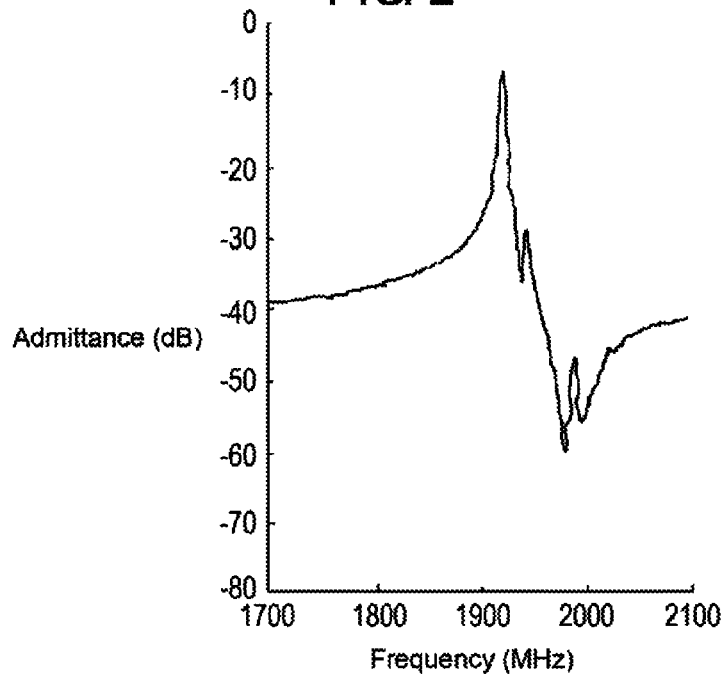
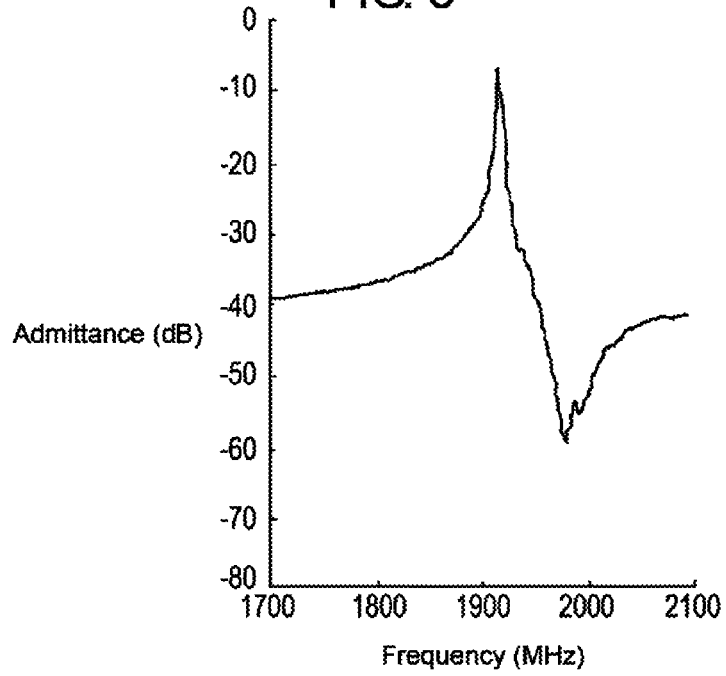

FIG. 31A — PRIOR ART
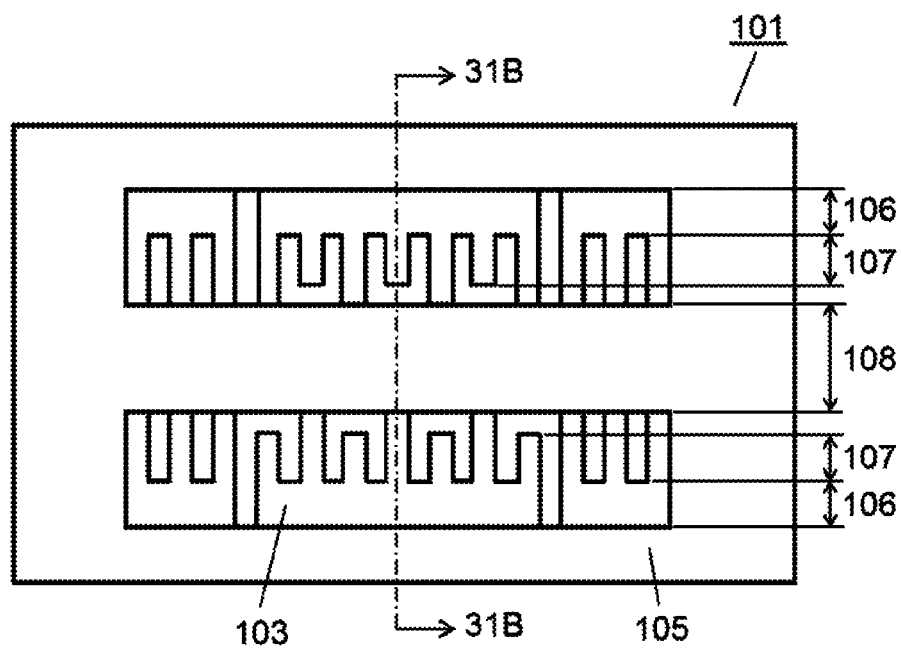
FIG. 31B — PRIOR ART
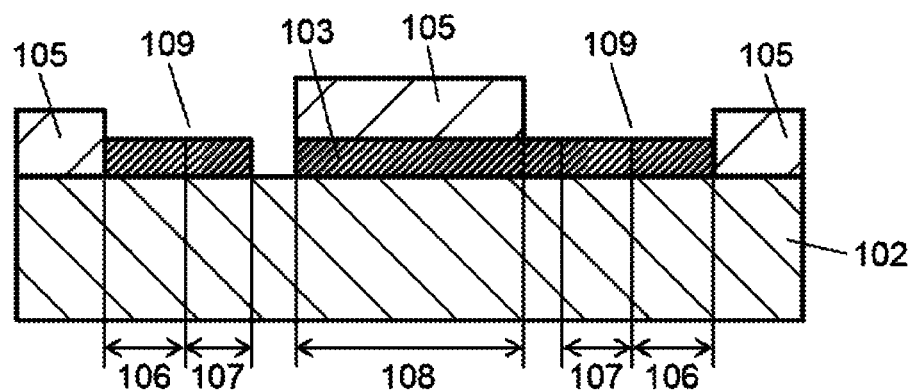

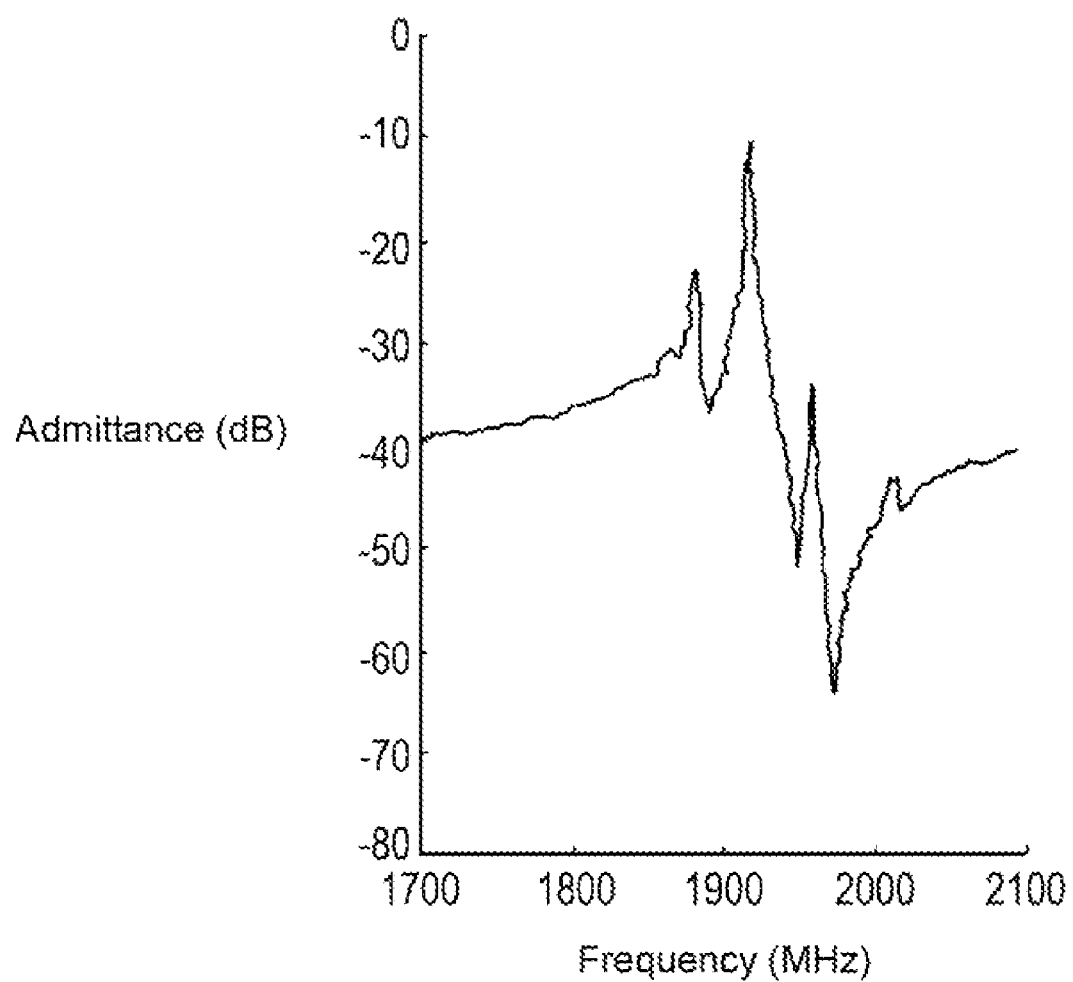
FIG. 32 – PRIOR ART

ACOUSTIC WAVE RESONATOR AND DUPLEXER USING SAME

This application is a U.S. national phase application of PCT international application PCT/JP2010/003459, filed May 24, 2010.

TECHNICAL FIELD

The present invention relates to an acoustic wave resonator and a duplexer using the resonator.

BACKGROUND ART

Conventionally, a piezoelectric body has been used with a large electromechanical coupling factor such as a lithium niobate ($LiNbO_3$) substrate to achieve an acoustic wave filter with wide-band characteristics.

However, an acoustic wave filter using this type of piezoelectric body typically has a disadvantage of poor temperature characteristics. To improve temperature characteristics, a way is devised in which a dielectric thin film made of $SiO_2$ is formed on a piezoelectric body made of lithium niobate.

FIGS. 31A and 31B show a configuration of a conventional acoustic wave resonator. FIG. 31A is a top view of the resonator, and FIG. 31B is a sectional view of the resonator, taken along line 31B-31B in FIG. 31A.

In FIGS. 31A and 31B, conventional acoustic wave resonator 101 includes piezoelectric body 102, and IDT (interdigital transducer) electrode 103 provided on piezoelectric body 102, for exciting an acoustic wave with wavelength λ. Resonator 101 includes dielectric thin film 105 provided on piezoelectric body 102 so as to cover IDT electrode 103. Electrode 103 includes bus bar electrode region 106, dummy electrode region 107, and IDT cross region 108, in order from outside.

Acoustic wave resonator 101 further has opening 109 in dielectric thin film 105 above bus bar electrode region 106 and dummy electrode region 107 to expose IDT electrode 103 in the regions.

This structure enables the sound velocity of an acoustic wave in bus bar electrode region 106 and dummy electrode region 107 of acoustic wave resonator 101 to be faster than that in IDT cross region 108. This condition, prevents leakage of an acoustic wave from IDT cross region 108 to dummy electrode region 107, which reduces insertion degradation loss of the acoustic wave.

As shown in FIG. 32, however, conventional acoustic wave resonator 101 disadvantageously generates more transverse-mode spurious emission between the resonance frequency and the antiresonance frequency. This is because conventional acoustic wave resonator 101 confines transverse-mode waves as well as main acoustic waves into IDT cross region 108.

There is known patent literature 1 as a prior art document related to the patent application.

CITATION LIST

Patent Literature

PTL 1 WO 2008/059780

SUMMARY OF THE INVENTION

An acoustic wave resonator includes a piezoelectric body, an IDT electrode provided on the piezoelectric body, for exciting an acoustic wave with wavelength λ; and a dielectric thin film provided on the piezoelectric body so as to cover the IDT electrode. The IDT electrode includes a bus bar electrode region, a dummy electrode region, and an IDT cross region, in order from outside. The film thickness of the dielectric thin film above at least one of the bus bar electrode region and the dummy electrode region is smaller than that above the IDT cross region by 0.1λ to 0.25λ.

Such a configuration of an acoustic wave resonator reduces transverse-mode waves in the IDT cross region to prevent transverse-mode spurious emission.

BRIEF DESCRIPTION OF DRAWINGS

FIG. 2 is an explanatory diagram of the frequency characteristics of the resonator.

FIG. 3 is an explanatory diagram of the frequency characteristics of the resonator.

FIG. 31A is a top view of a conventional acoustic wave resonator.
FIG. 31B is a sectional view of the acoustic wave resonator, taken along line 31B-31B in FIG. 31A.
FIG. 32 is an explanatory diagram of the frequency characteristics of the acoustic wave resonator.

DESCRIPTION OF EMBODIMENTS

First Exemplary Embodiment

Figure 1A:
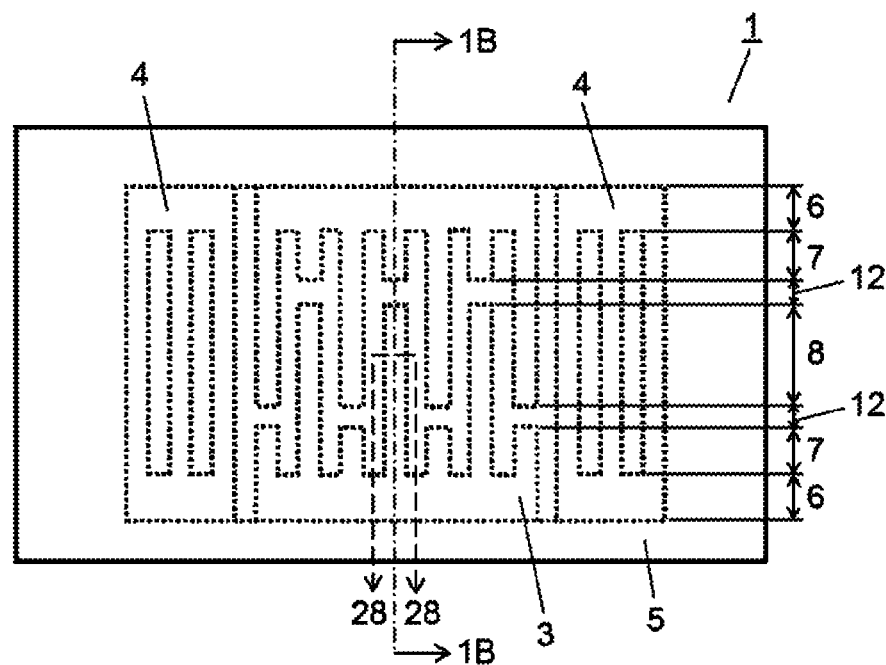
FIG. 1A is a top view of an acoustic wave resonator according to the first exemplary embodiment of the present invention.
Figure 1B:
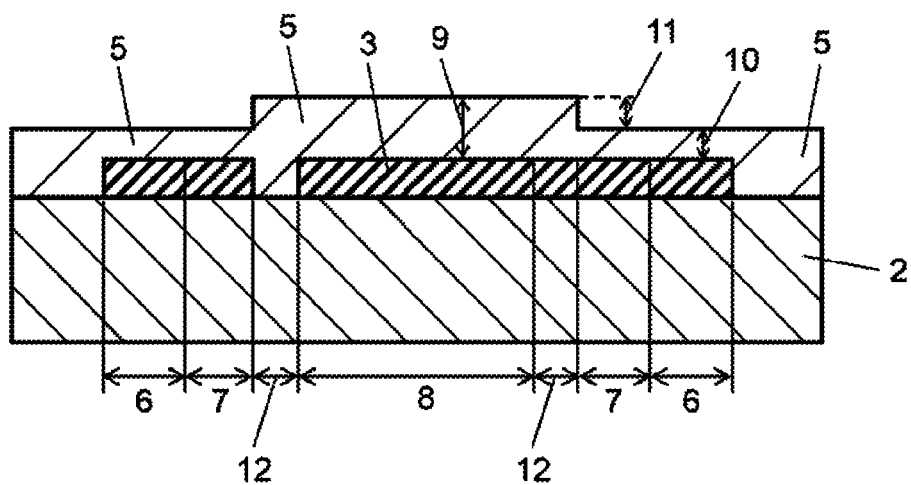
FIG. 1B is a sectional view of the resonator, taken along line 1B-1B in FIG. 1A.

Hereinafter, a description is made of the first exemplary embodiment of the present invention using the related drawings. FIG. 1A is a top view of an acoustic wave resonator according to the first embodiment; FIG. 1B is a cross sectional (a cross section along the direction in which the electrode fingers of IDT electrode 3 extend) view of the acoustic wave resonator, taken along line 1B-1B in FIG. 1A.

In FIGS. 1A and 1B, acoustic wave resonator 1 includes piezoelectric body 2; IDT electrode 3 provided on piezoelectric body 2, for exciting an acoustic wave with wavelength $\lambda$; grating reflector 4 provided on piezoelectric body 2 so as to interpose IDT electrode 3; and dielectric thin film 5 provided on piezoelectric body 2 so as to cover IDT electrode 3 and grating reflector 4.

Piezoelectric body 2 is a substrate based on lithium niobate ($LiNbO_3$); however, body 2 may be another piezoelectric single-crystal medium such as a substrate or thin film based on crystal, lithium tantalate ($LiTaO_3$), or potassium niobate ($KNbO_3$).

IDT electrode 3 is made of metal primarily containing aluminum; however, electrode 3 may be formed of one of the following three types of materials: a single metal such as copper, silver, gold, titanium, tungsten, platinum, chromium, or molybdenum; an alloy primarily containing at least one of these metals; or a lamination of at least one of these metals. When IDT electrode 3 is made of a metal primarily containing aluminum for example, the normalized film thickness of IDT electrode 3 needs to be between $0.045\lambda$ and $0.12\lambda$, where $\lambda$ is twice the electrode pitch in FIG. 1A.

IDT electrode 3 is a normal-type, comb-shaped electrode with a roughly constant cross width. In FIG. 1B, acoustic wave resonator 1 includes bus bar electrode region 6, dummy electrode region 7, and IDT cross region 8, in order from outside.

IDT cross region 8 is a region where electrode fingers of IDT electrodes 3 at the input and output sides cross each other and main acoustic waves (e.g. SH (shear horizontal) waves) are excited. Bus bar electrode region 6 is a region where bus bar electrodes that input an electric signal to the electrode fingers of IDT electrode 3 are placed. Dummy electrode region 7 is a region where dummy electrodes provided in parts where the electrode fingers of IDT electrodes 3 at the input and output sides do not cross each other are placed. The sound velocity in dummy electrode region 7 can be made different from that in the IDT cross region by adjusting the film thickness of the dummy electrodes and that of $SiO_2$ on the electrodes. Adjusting the difference in sound velocity enables transverse-mode waves to be dispersed into dummy electrode region 7 to reduce transverse-mode spurious emission.

Dielectric thin film 5 is made of silicon oxide for example; however any medium may be used as long as it has a propagation velocity of a side wave lower than the velocity of the slowest side wave propagating through piezoelectric body 2. Here, silicon oxide is a medium having frequency-temperature characteristics inverse to those of piezoelectric body 2, thereby improving the frequency-temperature characteristics of acoustic wave resonator 1.

The film thickness of dielectric thin film 5 above IDT cross region 8 is set so that the sound velocity of an acoustic wave excited by IDT electrode 3 is lower than the velocity of the slowest side wave propagating through piezoelectric body 2. This setting hopefully reduces leakage of main acoustic waves toward piezoelectric body 2.

Further, for dielectric thin film 5 made of silicon oxide, the film thickness of dielectric thin film 5 above IDT cross region 8 is set so that the frequency-temperature characteristic of a main acoustic wave excited by IDT electrode 3 is less than 10 ppm/° C.

Normalized film thickness 9 of dielectric thin film 5 above IDT cross region 8 satisfying the above conditions is between $0.2\lambda$ and $0.5\lambda$. Desirably, it is between $0.25\lambda$ and $0.5\lambda$, and more desirably between $0.3\lambda$ and $0.45\lambda$, which especially balances preventing leakage of an acoustic wave with improving the frequency-temperature characteristics.

Here, the film thickness of dielectric thin film 5 refers to the distance from the boundary surface between piezoelectric body 2 at a part where piezoelectric body 2 contacts dielectric thin film 5 (IDT electrode 3 is not formed) and dielectric thin film 5; to the top surface of dielectric thin film 5.

Here, when IDT electrodes 3 in bus bar electrode region 6 and dummy electrode region 7 are completely exposed in order to reduce leakage of a main acoustic wave from IDT cross region 8 to dummy electrode region 7, then transverse-mode waves have a stronger effect. This is because even transverse-mode waves (as well as main acoustic waves) are confined in IDT cross region 8 of acoustic wave resonator 1.

Thus in the first embodiment, normalized film thickness 10 of dielectric thin film 5 above at least one of bus bar electrode region 6 and dummy electrode region 7 is made smaller than normalized film thickness 9 of dielectric thin film 5 above IDT cross region 8 by $0.1\lambda$ to $0.25\lambda$.

This condition suppresses transverse-mode waves in IDT cross region 8 to reduce transverse-mode spurious emission. This is because the difference in sound velocity in IDT cross region 8 and dummy electrode region 7 is decreased to cause acoustic coupling between transverse-mode waves excited in IDT cross region 8 and those excited in dummy electrode region 7. The coupling possibly disperses energy of transverse-mode waves resonated in IDT cross region 8 toward dummy electrode region 7. Although the difference in sound velocity has been decreased, the sound velocity in dummy electrode region 7 is higher than that in IDT cross region 8 in the configuration.

Hereinafter, a description is made of the frequency characteristics of acoustic wave resonator 1 according to the first embodiment using the related drawings. FIGS. 2 through 7 are explanatory diagrams of the frequency characteristics of an acoustic wave resonator according to the first embodiment of the present invention, each showing the frequency characteristics of admittance of acoustic wave resonator 1.

Figure 4:
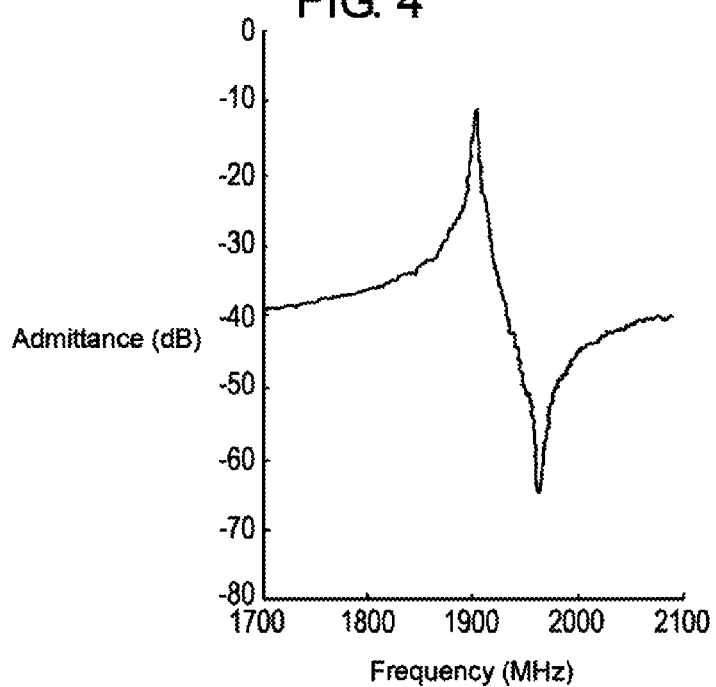
FIG. 4 is an explanatory diagram of the frequency characteristics of the resonator.
Figure 5:
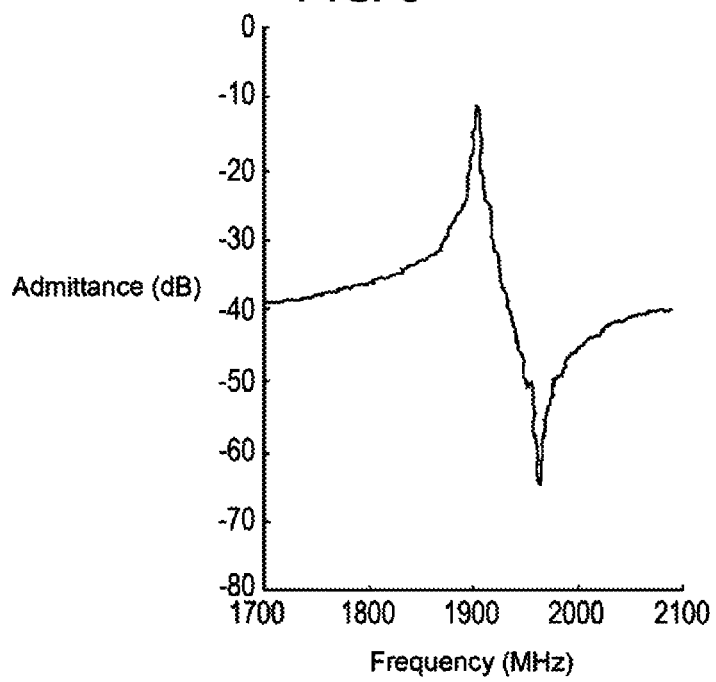
FIG. 5 is an explanatory diagram of the frequency characteristics of the resonator.
Figure 6:
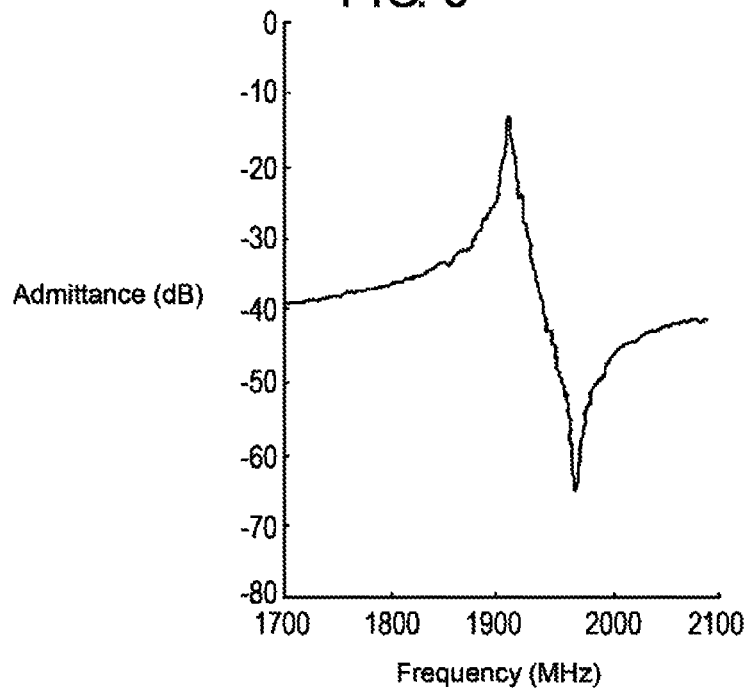
FIG. 6 is an explanatory diagram of the frequency characteristics of the resonator.
Figure 7:
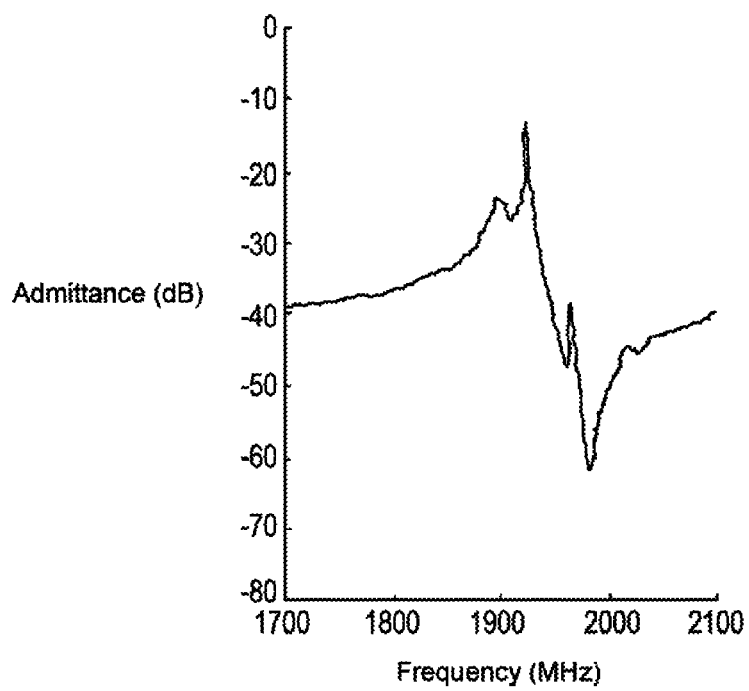
FIG. 7 is an explanatory diagram of the frequency characteristics of the resonator.

For piezoelectric body 2 of acoustic wave resonator 1, a rotating Y plate (cut angle: 5 degrees) of a lithium niobate substrate is used. For IDT electrode 3, a normal-type, comb-shaped electrode is used made of aluminum with a normalized film thickness of $0.08\lambda$. For dielectric thin film 5, a dielectric thin film is used made of silicon oxide with a normalized film thickness of $0.37\lambda$. For normalized film thickness difference 11 between normalized film thickness 9 of dielectric thin film 5 above IDT cross region 8; and normalized film thickness 10 of dielectric thin film 5 above bus bar electrode region 6 and dummy electrode region 7, FIG. 2 shows the cases of $0\lambda$; FIG. 3, $0.11\lambda$; FIG. 4, $0.15\lambda$; FIG. 5, $0.20\lambda$; FIG. 6, $0.24\lambda$; and FIG. 7, $0.28\lambda$.

Figure 8:
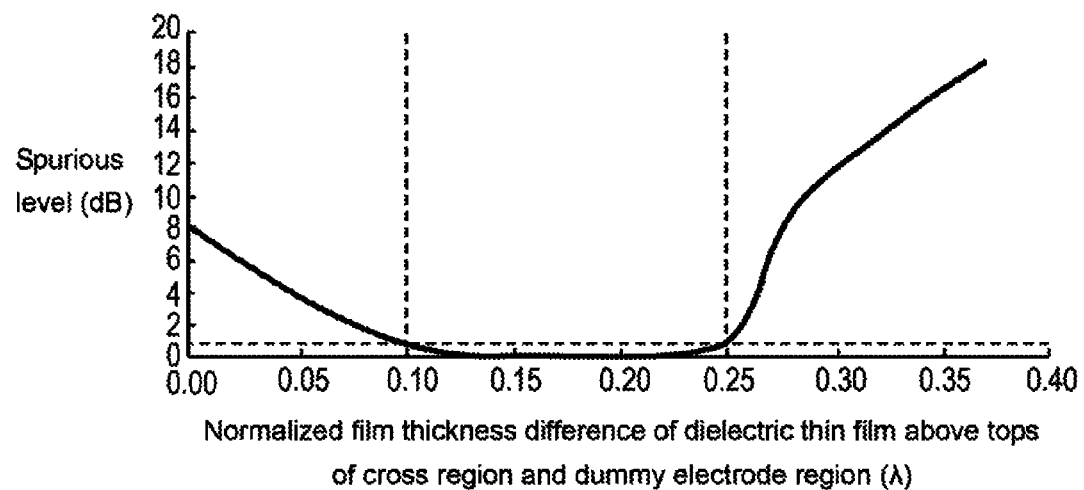
FIG. 8 is an explanatory diagram of the spurious level of the resonator.

FIG. 8 shows a relationship between normalized film thickness difference 11 (horizontal axis: $\lambda$) of dielectric thin film 5 between above IDT cross region 8 and above dummy electrode region 7 of this acoustic wave resonator 1; and transverse-mode spurious emission (vertical axis: dB).

As shown in FIGS. 2 through 8, when normalized film thickness difference 11 of dielectric thin film 5 between above IDT cross region 8 and above dummy electrode region 7 is $0.10\lambda$ to $0.25\lambda$, the transverse-mode spurious level can be reduced to within approximately 1 dB. When difference 11 is $0.15\lambda$ to $0.20\lambda$, the transverse-mode spurious level can be reduced to roughly 0 dB.

To provide normalized film thickness difference 11 in dielectric thin film 5 between above IDT cross region 8 and above dummy electrode region 7, dielectric thin film 5 may be etched after film-formed. Alternatively, by masking dummy electrode region 7 and bus bar electrode region 6 of IDT electrode 3 halfway of film-forming dielectric thin film 5, film 5 may be made enter a non-formed state from halfway of film-forming.

To further reduce transverse-mode spurious emission, IDT electrode 3 may be apodized weighted (the cross width becomes gradually narrower from the center of the IDT electrode toward grating reflector 4). At this moment, dummy electrode region 7 becomes a region with the minimum length of the dummy electrodes of IDT electrode 3, and IDT cross region 8 becomes a region with the maximum length where IDT electrodes 3 cross each other. As described above, however, it is advantageous if normal-type, comb-shaped electrode 3, not apodized-weighted, can reduce transverse-mode spurious emission. That is, the configuration can prevent degration of the resonator characteristics (e.g. the Q value) due to apodized weighting on IDT electrode 3, which is advantageous in characteristics in implementing acoustic wave resonator 1.

Hereinbefore, the description is made of the configuration in which normalized film thickness 10 of dielectric thin film 5 above all the regions in bus bar electrode region 6 and dummy electrode region 7 is smaller than normalized film thickness 9 of dielectric thin film 5 above IDT cross region 8. However, normalized film thickness 10 of dielectric thin film 5 above part of bus bar electrode region 6 and dummy electrode region 7 may be smaller than normalized film thickness 9 of dielectric thin film 5 above IDT cross region 8 by $0.1\lambda$ to $0.25\lambda$. For example, the film thickness of dielectric thin film 5 above only dummy electrode region 7 may be smaller than normalized film thickness 9 of dielectric thin film 5 above IDT cross region 8 by $0.1\lambda$ to $0.25\lambda$. However, the configuration shown in FIGS. 1A and 1B is more advantageous than this configuration from the viewpoint of reducing transverse-mode spurious emission.

The step between dielectric thin film 5 above IDT cross region 8 and dielectric thin film 5 above dummy electrode region 7 is desirably formed roughly perpendicular to the top surface of dielectric thin film 5; however, the step may be tapered. The end of dielectric thin film 5 at this step is desirably positioned the same as the end of dummy electrode region 7; however, the end of film 5 may be formed in gap region 12 between dummy electrode region 7 and IDT cross region 8. This condition prevents this step from adversely affecting the frequency characteristics of acoustic wave resonator 1, which reduces unnecessary spurious emission.

Figure 9:
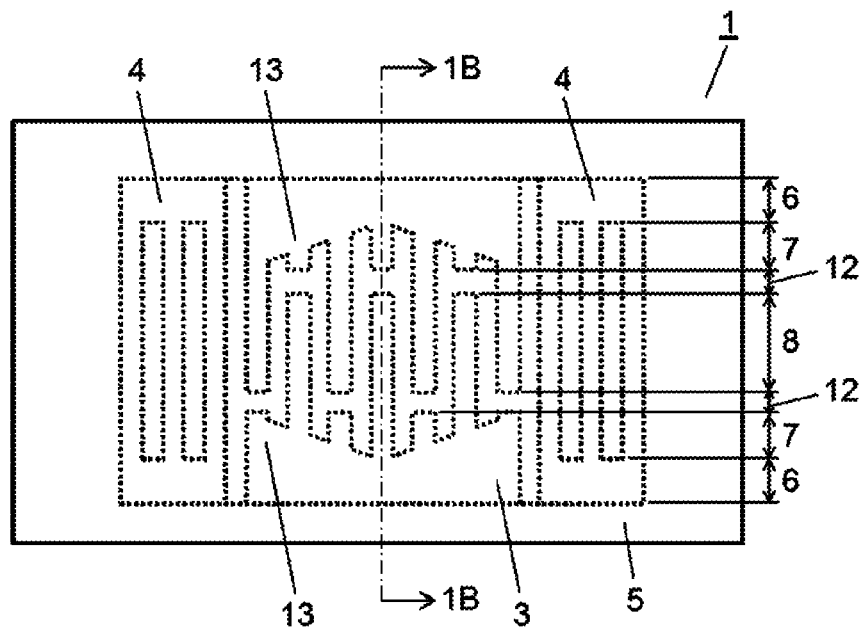
FIG. 9 is a top view of another acoustic wave resonator according to the first embodiment of the present invention.

As shown in FIG. 9, dummy electrode region 7 may be provided with metallized dummy electrode weighting part 13. In this case as well, normalized film thickness difference 11 of dielectric thin film 5 between above IDT cross region 8 and above dummy electrode region 7 being $0.10\lambda$ to $0.25\lambda$ reduces the transverse-mode spurious level.

In the first embodiment, the dielectric thin film layer on IDT electrode 3 and dummy electrode is one-layered; however, the layer may be two-layered or more.

In the first embodiment, the description is made for a case where acoustic wave resonator 1 is provided with grating reflector 4; however, the same advantage is obtained in a case where grating reflector 4 is not provided because the present invention is applied to IDT electrode 3.

Figure 10:
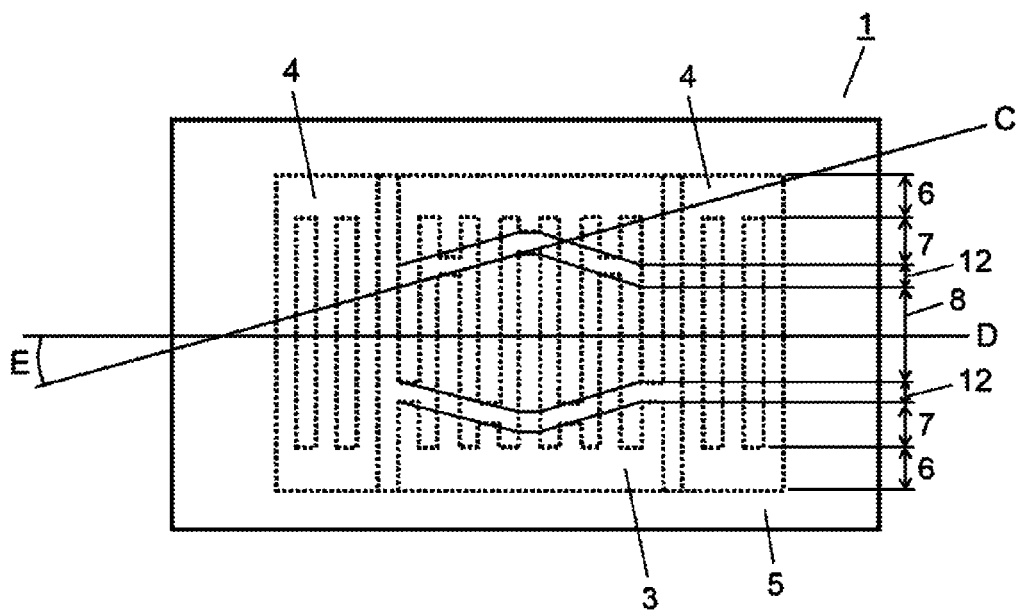
FIG. 10 is a top view of yet another acoustic wave resonator according to the first embodiment of the present invention.

As shown in FIG. 10, IDT electrode 3 may be apodized weighted (the cross width becomes gradually narrower from the center of IDT cross region 8 toward its end in the direction of the acoustic wave propagation). In a case where IDT electrode 3 is thus apodized-weighted as well, dummy electrode region 7, IDT cross region 8, and gap region 12 are defined by a shape formed by connecting the front ends of the electrode fingers as shown in FIG. 10.

Figure 11:
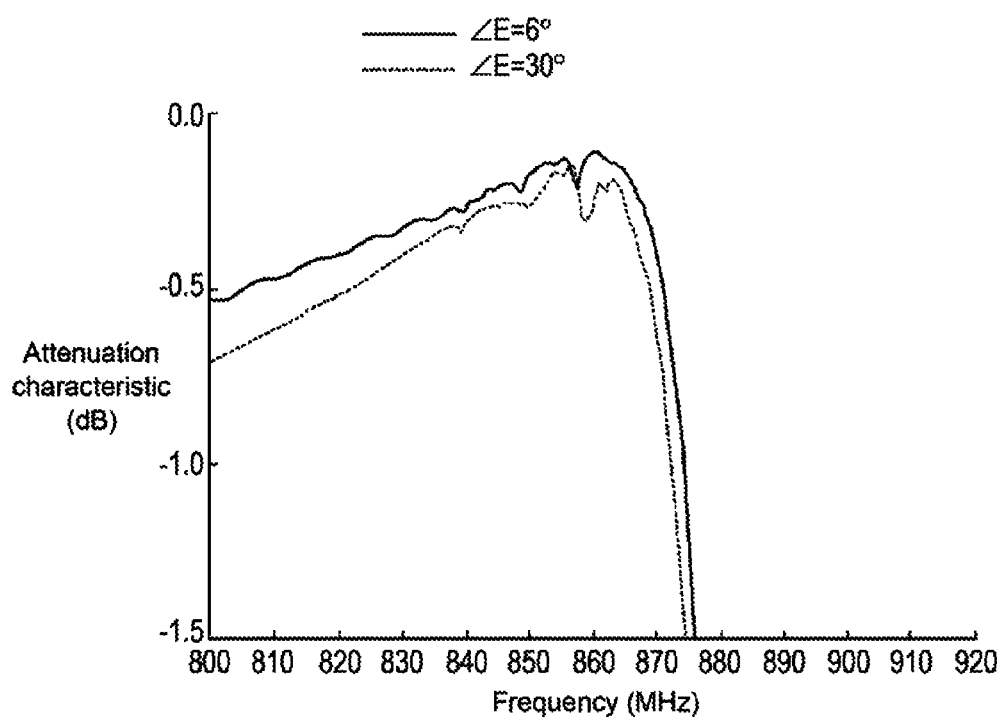
FIG. 11 is an explanatory diagram of the frequency characteristics of an acoustic wave resonator according to the first embodiment of the present invention.

At this moment, angle $\angle E$ formed by straight line C connecting the front ends of the electrode fingers from the center of IDT cross region 8 toward its end; and direction D of the acoustic wave propagatation is desirably between 4 and 10 degrees. This condition reduces transverse-mode spurious emission as shown in FIG. 11. The characteristic diagram of FIG. 11 shows the frequency attenuation characteristics (dB) of acoustic wave resonator 1 under the same conditions as the above, where the solid line represents that angle ∠E is 6°; the broken line, 30°.

Second Exemplary Embodiment

Figure 12A:
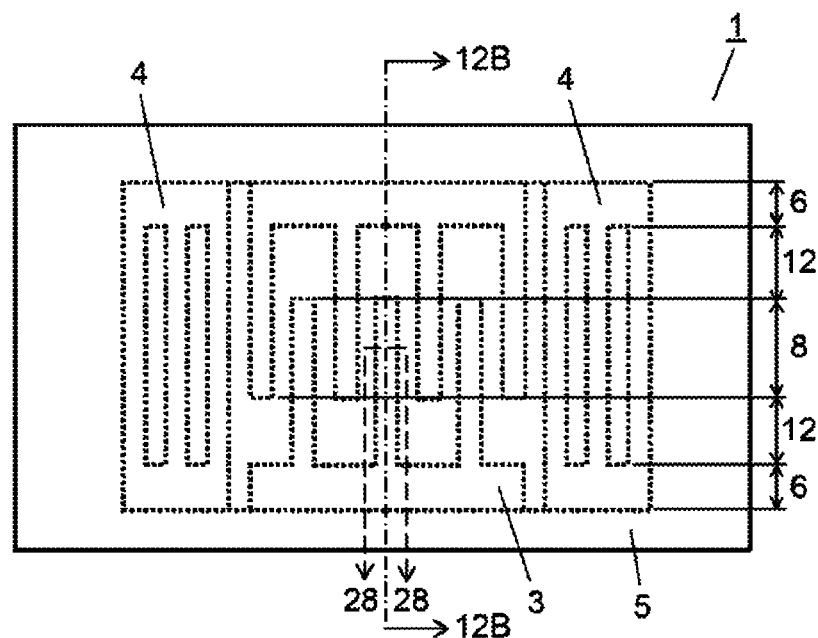
FIG. 12A is a top view of an acoustic wave resonator according to the second exemplary embodiment of the present invention.
Figure 12B:
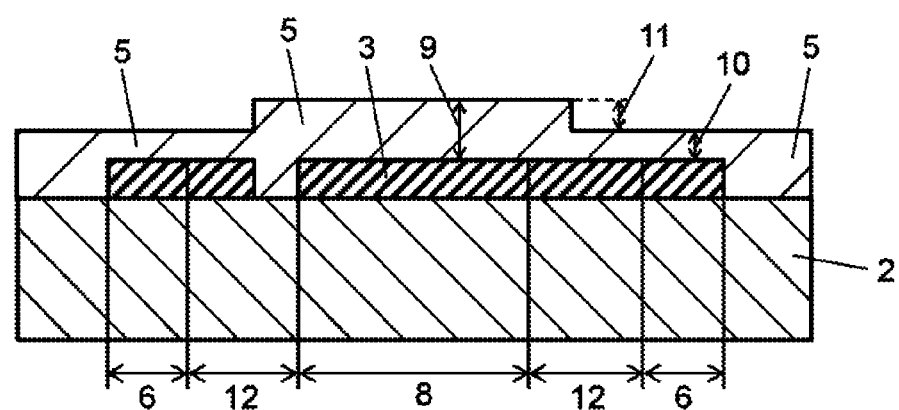
FIG. 12B is a sectional view of the resonator, taken along line 12B-12B in FIG. 12A.

Next, a description is made of acoustic wave resonator 1 of the second exemplary embodiment using the related drawings. The configuration is the same as that of the first embodiment unless particularly described. FIG. 12A is a top view of acoustic wave resonator 1 according to the second embodiment; FIG. 12B is a cross sectional (a cross section along the direction in which the electrode fingers of IDT electrode 3 extend) view of the acoustic wave resonator, taken along line 12B-12B in FIG. 12A.

As shown in FIGS. 12A and 12B, acoustic wave resonator 1 of the second embodiment does not have a dummy electrode, and the entire region interposed between bus bar electrode region 6 and IDT cross region 8 becomes gap region 12. Here as well, normalized film thickness 10 of dielectric thin film 5 above a part of at least one (both in FIG. 12) of bus bar electrode region 6 and gap region 12 (the side of bus bar electrode region 6) is configured to be smaller than normalized film thickness 9 of dielectric thin film 5 above IDT cross region 8 by 0.1λ to 0.25λ.

This condition suppresses transverse-mode waves in IDT cross region 8 to reduce transverse-mode spurious emission. This is because the difference in sound velocity in IDT cross region 8 and gap region 12 is decreased to cause acoustic coupling between transverse-mode waves excited in IDT cross region 8 and those excited in gap region 12. In other words, this is possibly because the coupling disperses energy of transverse-mode waves resonating in IDT cross region 8 toward gap region 12.

In this case, the step on the top surface of dielectric thin film 5 is desirably formed above gap region 12. This condition prevents this step from adversely affecting the frequency characteristics of acoustic wave resonator 1, which reduces unnecessary spurious emission.

Third Exemplary Embodiment

Figure 13:
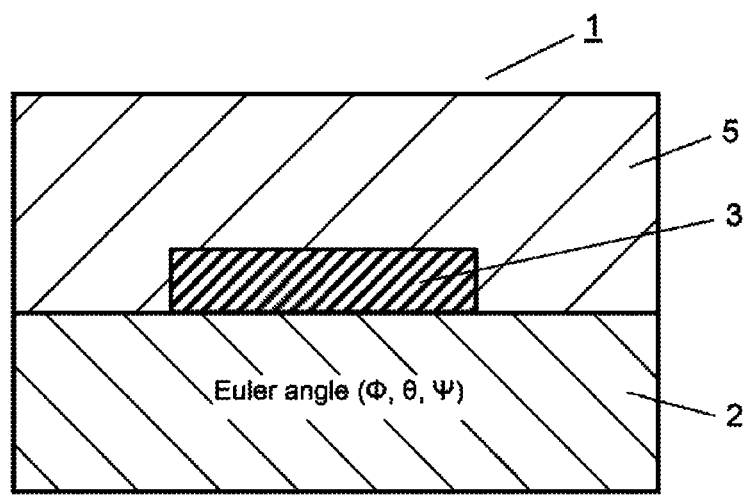
FIG. 13 is a sectional view of the resonator according to the third exemplary embodiment, taken along line 13-13 in FIG. 12A.

Next, a description is made of acoustic wave resonator 1 of the third exemplary embodiment using the related drawings. The configuration is the same as that of the first embodiment unless particularly described. FIG. 13 is a cross sectional (a cross section of IDT cross region 8) view, taken along line 13-13 in FIG. 1A according to the first embodiment or line 13-13 in FIG. 12A according to the second embodiment.

In acoustic wave resonator 1 of FIG. 13, piezoelectric body 2 is based on lithium niobate ($LiNbO_3$), and the Euler angle ($\phi$, $\theta$, $\psi$) of this piezoelectric body 2 satisfies $-100° \leq \theta \leq -60°$, $1.193\phi - 2° \leq \psi \leq 1.193\phi + 2°$, $\psi \leq -2\phi - 3°$, $-2\phi + 3° \leq \psi$ where $\phi$ and $\theta$ are cut-out angles of piezoelectric body 2; $\psi$ is the propagation angle of a main acoustic wave in IDT electrode 3 on piezoelectric body 2.

Here, piezoelectric body 2 based on lithium niobate is a trigonal crystal, and thus the Euler angle has the next relationship.

$$(\varphi, \theta, \Psi) = (60 + \varphi, -\theta, \Psi)$$

$$= (60 - \varphi, -\theta, 180 - \Psi)$$

$$= (\varphi, 180 + \theta, 180 - \Psi)$$

$$= (\varphi, \theta, 180 + \Psi)$$

Dielectric thin film 5 is made of a silicon oxide ($SiO_2$) film. Film 5 has temperature characteristics inverse to those of piezoelectric body 2, thereby improving the frequency-temperature characteristics of acoustic wave resonator 1 by making the film thickness thicker than a given one.

In this way, for the film thickness of dielectric thin film 5 made thicker than a given one in order to improve the frequency-temperature characteristics of acoustic wave resonator 1, when Euler angle ($\phi$, $\theta$, $\psi$) of piezoelectric body 2 made of lithium niobate is changed from $\phi = \psi = 0°$ while keeping $\phi$ and $\psi$ larger than a given angle and $\psi = 1.193\phi$ to some extent, unnecessary spurious emission near a frequency band where a fast side wave occurs can be prevented while unnecessary spurious emission due to a Rayleigh wave is reduced.

Next, a detailed description is made of effects and advantages that unnecessary spurious emission is reduced for the Euler angle of piezoelectric body 2 made of lithium niobate in a specific range.

Figure 14:
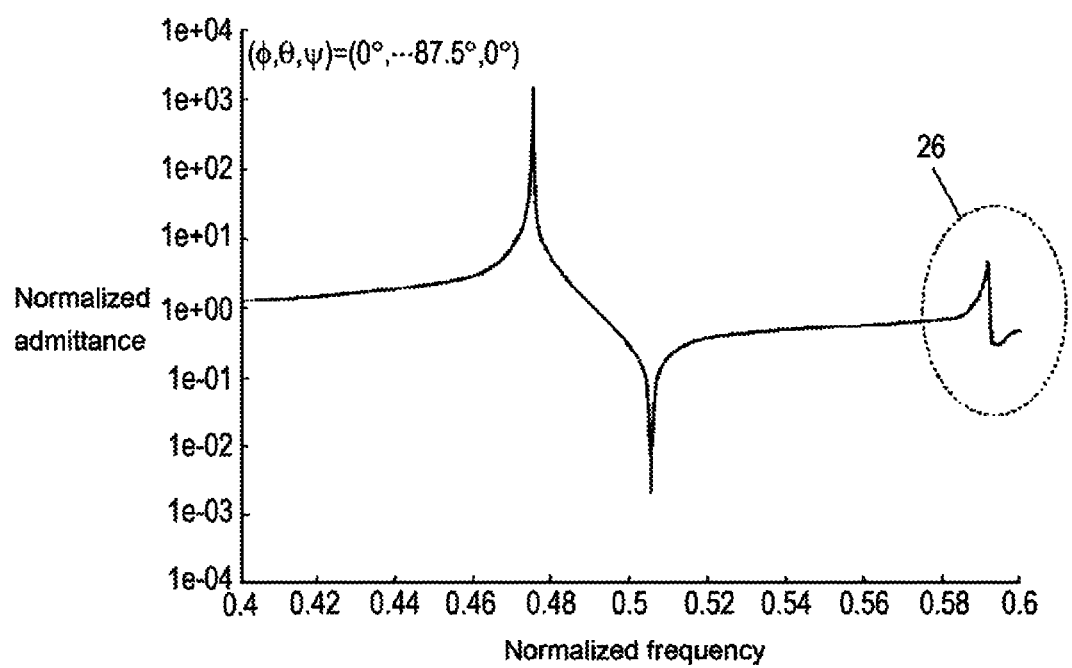
FIG. 14 illustrates the characteristics of the acoustic wave resonator.
Figure 15:
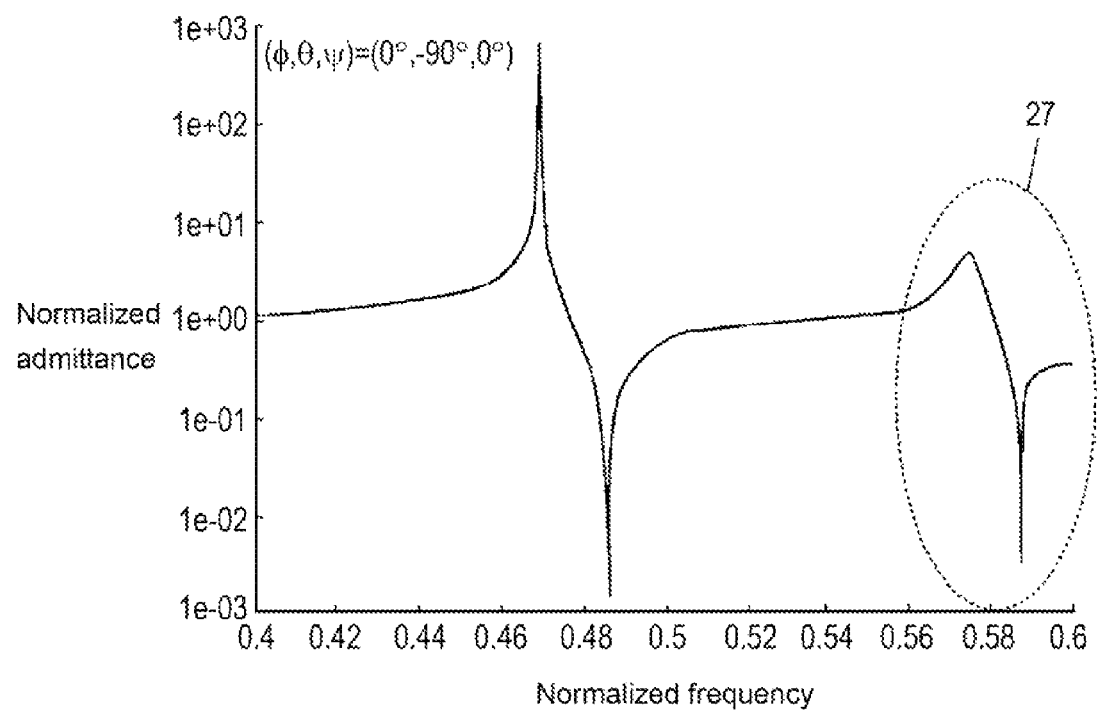
FIG. 15 illustrates the characteristics of the resonator.

FIGS. 14 and 15 are frequency characteristic diagrams of acoustic wave resonator 1 for the Euler angle ($\phi$, $\psi = 0°$ of piezoelectric body 2 based on lithium niobate. The film thickness of dielectric thin film 5 made of silicon oxide above IDT cross region 8 is assumed to be 0.35λ for example in order to improve the temperature characteristics of acoustic wave resonator 1. Then, as shown in FIGS. 14 and 15, unnecessary spurious emission 26 and 27 occur near the frequency of 1.2 times the resonance frequency.

FIG. 14 is a characteristic diagram in a case where piezoelectric body 2 is based on lithium niobate with an Euler angle (0°, −87.5°, 0°); IDT electrode 3 is made of copper with a film thickness of 0.03λ; and dielectric thin film 5 is made of silicon dioxide with a film thickness of 0.35λ with its top surface flat above IDT cross region 8.

FIG. 15 is a characteristic diagram in a case where piezoelectric body 2 is based on lithium niobate with an Euler angle (0°, −90°, 0°); IDT electrode 3 is made of aluminum with a film thickness of 0.08λ; and dielectric thin film 5 has a projection on its top surface above the electrode fingers of IDT electrode 3 above IDT cross region 8, made of silicon oxide with a film thickness of 0.35λ. Here, this projection is higher than 0.03λ and lower than IDT electrode 3, and the top of the projection is narrower than the electrode fingers of IDT electrode 3.

In FIGS. 14 and 15, the vertical axis represents normalized admittance for a matched value; the horizontal axis represents a normalized frequency for half the frequency of a slow side wave (sound velocity: 4,024 m/s) occurring in acoustic wave resonator 1. This condition is the same for other characteristic diagrams. A possible cause of this unnecessary spurious emission is a fast side wave occurring in acoustic wave resonator 1. Here, the side wave with the highest sound velocity out of those occurring in acoustic wave resonator 1 is referred to as a fast side wave; the lowest one, a slow side wave.

Figure 16A:
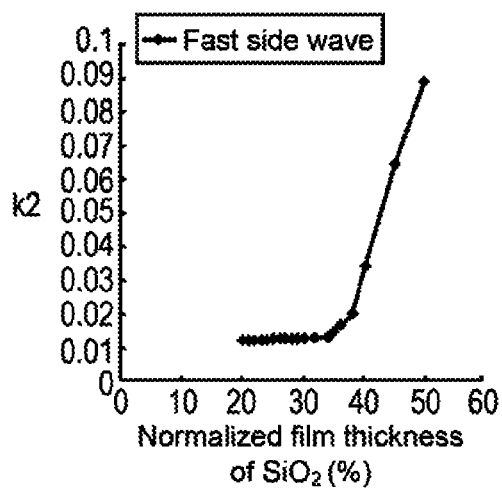
FIG. 16A illustrates the characteristics of an acoustic wave resonator according to the third exemplary embodiment of the present invention.
Figure 16B:
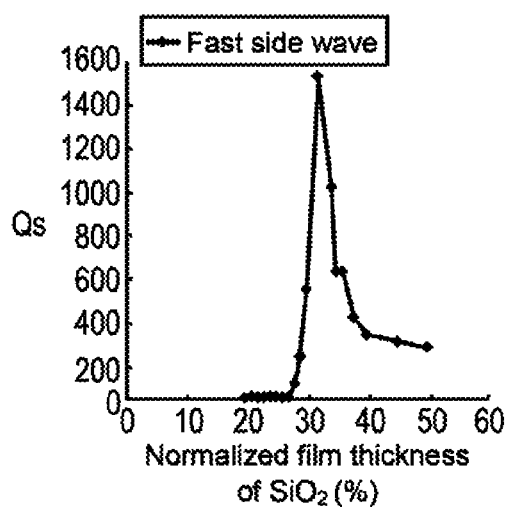
FIG. 16B illustrates the characteristics of the resonator.
Figure 16C:
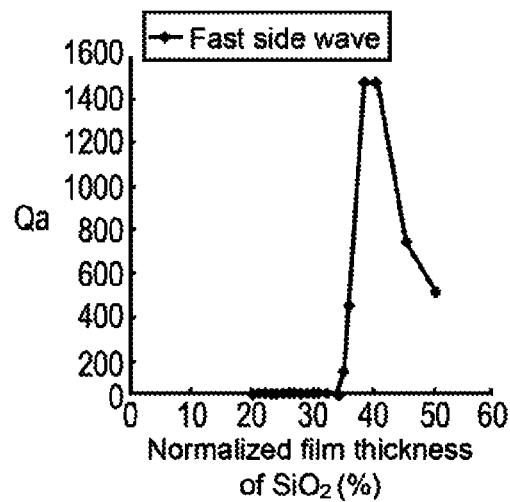
FIG. 16C illustrates the characteristics of the resonator.

FIGS. 16A through 16C show the above-described acoustic wave resonator in a case where piezoelectric body 2 is made of lithium niobate with an Euler angle (0°, −87.5°, 0°); IDT electrode 3 is made of copper with a film thickness of 0.03λ. For dielectric thin film 5 made of silicon oxide with its top surface flat above IDT cross region 8, the figures respectively show an electromechanical coupling factor (FIG. 16A), a Q value (Qs) of resonance (FIG. 16B), and a Q value (Qa) of antiresonance (FIG. 16C) of a fast side wave when the film thickness of dielectric thin film 5 above IDT cross region 8 is changed. As shown in FIG. 16B, the film thickness of dielectric thin film 5 above IDT cross region 8 thicker than $0.27\lambda$ increases the Q value of resonance of a fast side wave. Further, as shown in FIG. 16C, the film thickness of dielectric thin film 5 above IDT cross region 8 thicker than $0.34\lambda$ increases the Q value of antiresonance of a fast side wave as well.

Figure 17A:
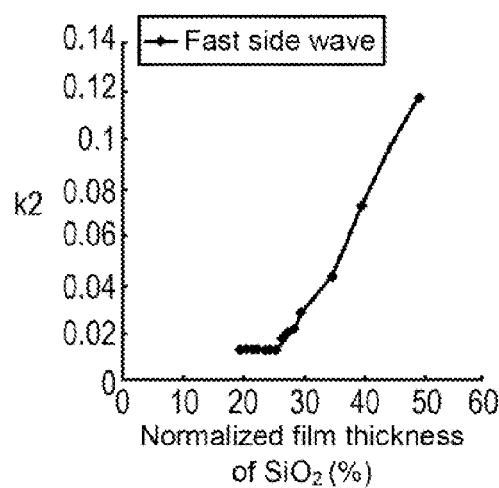
FIG. 17A illustrates the characteristics of an acoustic wave resonator according to the third exemplary embodiment of the present invention.
Figure 17B:
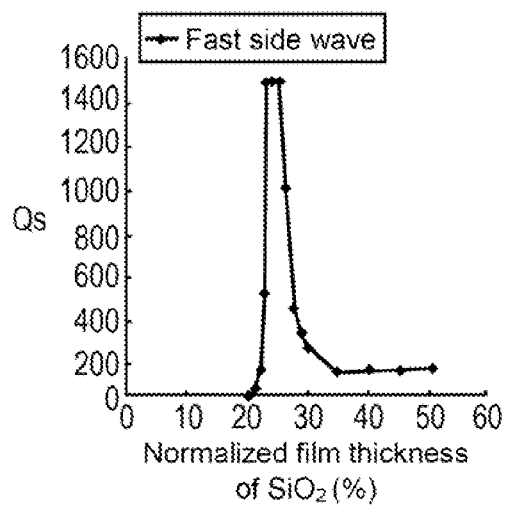
FIG. 17B illustrates the characteristics of the resonator.
Figure 17C:
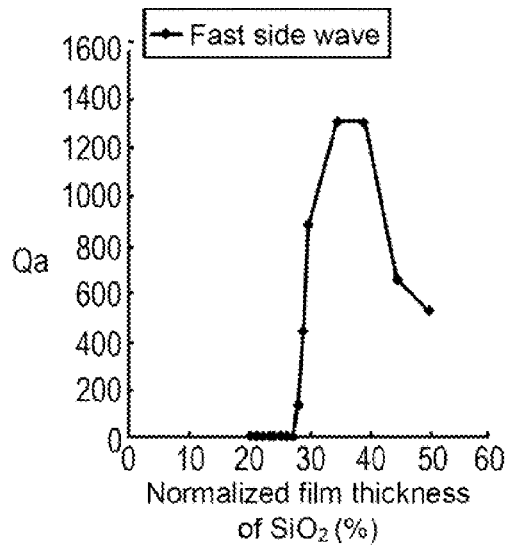
FIG. 17C illustrates the characteristics of the resonator.
Figure 18A:
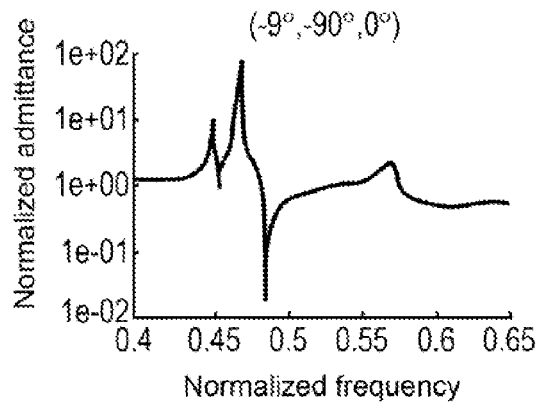
FIG. 18A illustrates the characteristics of an acoustic wave resonator according to the third exemplary embodiment of the present invention.
Figure 18B:
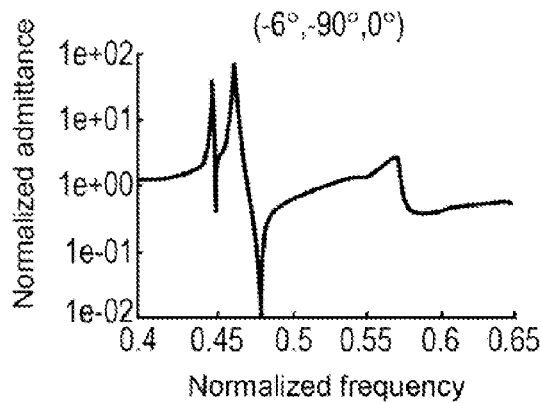
FIG. 18B illustrates the characteristics of the resonator.
Figure 18C:
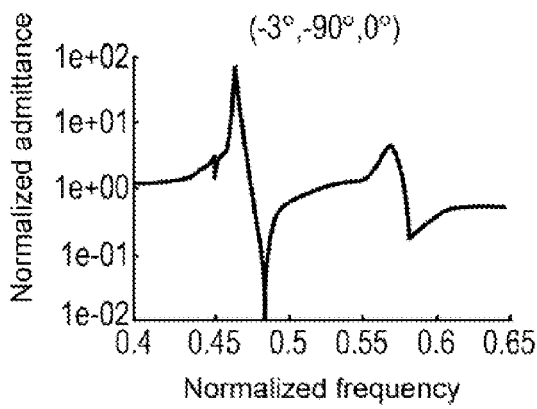
FIG. 18C illustrates the characteristics of the resonator.
Figure 18D:
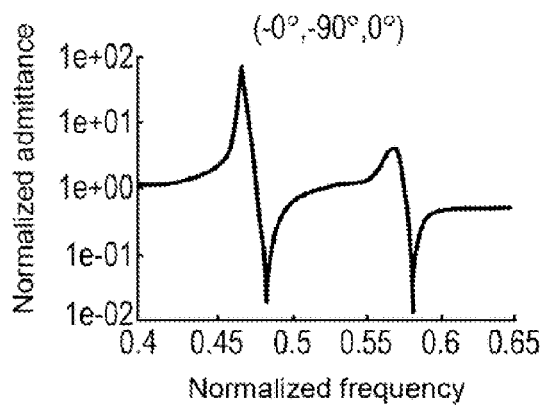
FIG. 18D illustrates the characteristics of the resonator.
Figure 18E:
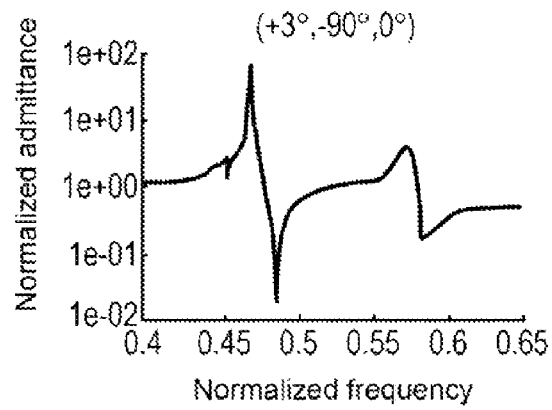
FIG. 18E illustrates the characteristics of the resonator.
Figure 18F:
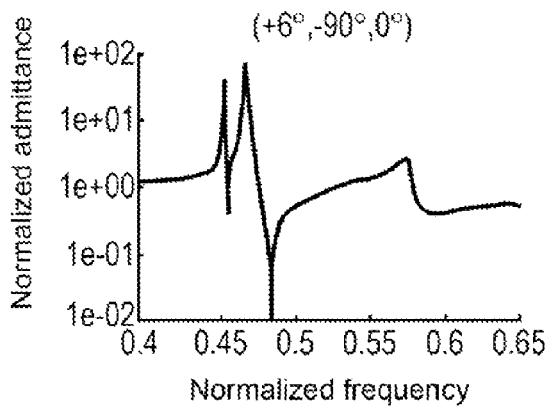
FIG. 18F illustrates the characteristics of the resonator.
Figure 18G:
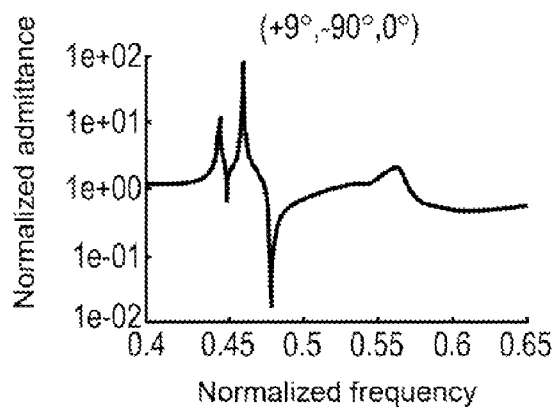
FIG. 18G illustrates the characteristics of the resonator.
Figure 19A:
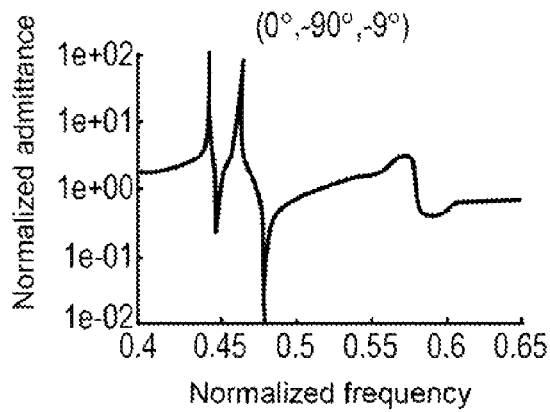
FIG. 19A illustrates the characteristics of an acoustic wave resonator according to the third exemplary embodiment of the present invention.
Figure 19B:
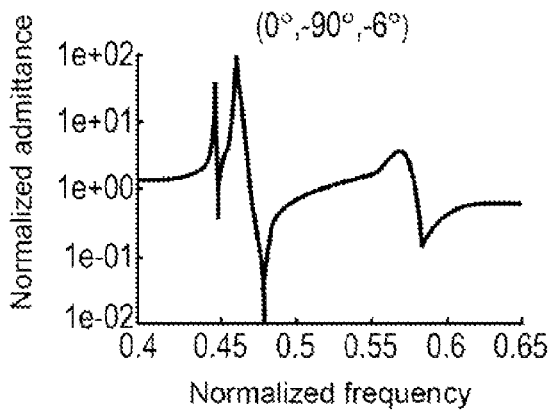
FIG. 19B illustrates the characteristics of the resonator.
Figure 19C:
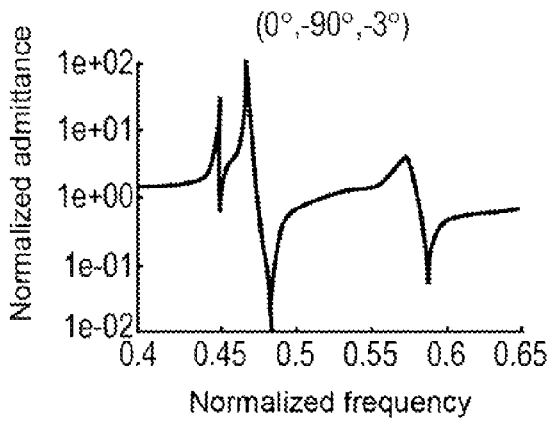
FIG. 19D illustrates the characteristics of the resonator.
FIG. 19E illustrates the characteristics of the resonator.
FIG. 19F illustrates the characteristics of the resonator.
FIG. 19G illustrates the characteristics of the resonator.
Figure 19D:
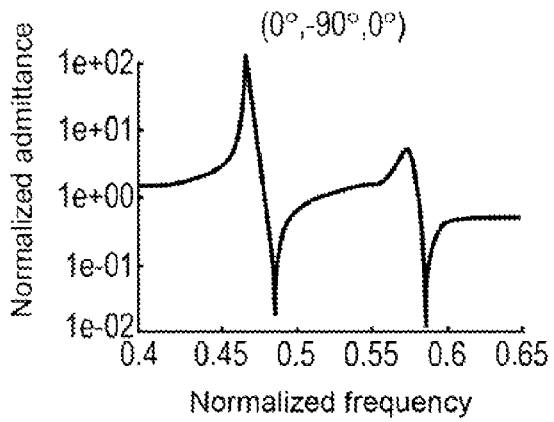
Figure 19E:
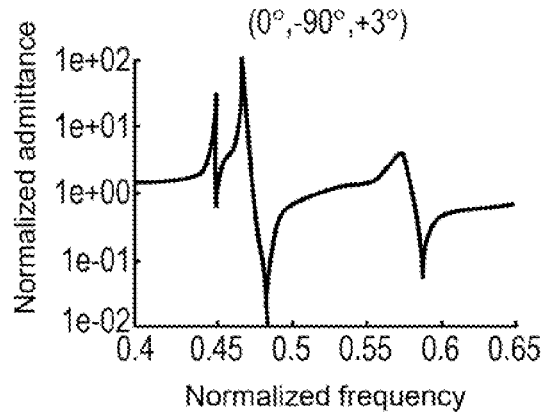
Figure 19F:
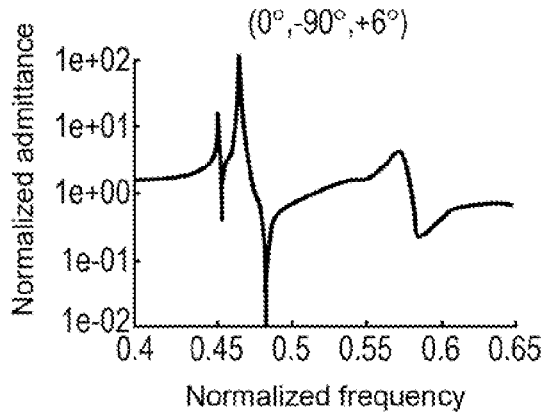
Figure 19G:
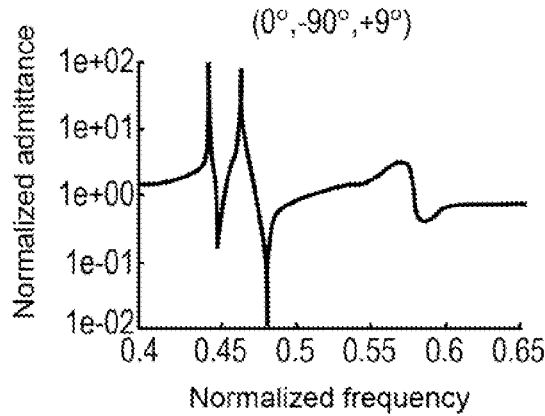

FIGS. 17A through 17C show the above-described acoustic wave resonator in a case where piezoelectric body 2 is made of lithium niobate with an Euler angle (0°, −90°, 0°); IDT electrode 3 is aluminum with a film thickness of $0.08\lambda$. For dielectric thin film 5 made of silicon oxide with its top surface having the projection above the electrode fingers of IDT electrode 3, the figures respectively show an electromechanical coupling factor (FIG. 17A), a Q value (Qs) of resonance (FIG. 17B), and a Q value (Qa) of antiresonance (FIG. 17C) of a fast side wave when the film thickness of dielectric thin film 5 above IDT cross region 8 is changed. As shown in FIG. 17B, the film thickness of dielectric thin film 5 above IDT cross region 8 thicker than $0.2\lambda$ increases the Q value of resonance of a fast side wave. Further, as shown in FIG. 17C, the film thickness of dielectric thin film 5 above IDT cross region 8 thicker than $0.27\lambda$ increases the Q value of antiresonance of a fast side wave as well.

The above-described fast side wave undesirably degrades the characteristics quality of a filter or duplexer with this acoustic wave resonator applied thereto. To reduce this unnecessary spurious emission, $\phi$ and $\psi$ of Euler angle ($\phi$, $\theta$, $\psi$) of piezoelectric body 2 are changed. The case of changing $\phi$ is shown in FIGS. 18A through 18G; $\psi$, in FIGS. 19A through 19G.

FIGS. 18A through 18G and FIGS. 19A through 19G are characteristic diagrams for a case where piezoelectric body 2 is made of lithium niobate having an Euler angle; IDT electrode 3 is made of aluminum with a film thickness of $0.08\lambda$; dielectric thin film 5 has the above-described projection on its top surface above the electrode fingers of IDT electrode 3 above IDT cross region 8, and is made of silicon oxide with a film thickness of $0.35\lambda$. Here, Euler angle ($\phi$, $\theta$, $\psi$) of piezoelectric body 2 is shown at top of each characteristic diagram of FIGS. 18A through 18G and FIGS. 19A through 19G. As shown in these figures, unnecessary spurious emission can be reduced when $\phi$ is changed and also when $\psi$ is changed; on the other hand, unnecessary spurious emission different from the above occurs in a frequency band slightly lower than the resonance frequency. This unnecessary spurious emission is possibly spurious emission due to a Rayleigh wave.

In FIGS. 18 through 18G and FIGS. 19A through 19G, the admittance characteristics of an acoustic wave element of $1e^{+02}$ or higher and of $1e^{-02}$ or lower are not shown.

When the film thickness of dielectric thin film 5 above IDT cross region 8 of acoustic wave resonator 1 is larger than $0.27\lambda$, unnecessary spurious emission due to a Rayleigh wave, as well as due to a fast side wave, is reduced. For this purpose, acoustic wave resonator 1 includes piezoelectric body 2 having Euler angle ($\phi$, $\theta$, $\psi$), based on lithium niobate; IDT electrode 3 provided on this piezoelectric body 2, for exciting a main acoustic wave with wavelength $\lambda$; and dielectric thin film 5 provided on piezoelectric body 2 so as to cover this IDT electrode 3, thicker than $0.27\lambda$ above IDT cross region 8. Further, the Euler angle of piezoelectric body 2 satisfies $-100° \leq \theta \leq -60°$, $1.193\phi-2° \leq \psi \leq 1.193\phi+2°$, $\psi \leq -2\phi-3°$, and $-2\phi+3° \leq \psi$.

As described above, when Euler angle ($\phi$, $\theta$, $\psi$) of piezoelectric body 2 is changed from $\phi=\psi=0°$ while keeping $\phi$ and $\psi$ larger than a given angle and $\psi=1.193\phi$ to some extent, unnecessary spurious emission near a frequency band where a fast side wave occurs can be prevented while unnecessary spurious emission due to a Rayleigh wave is reduced.

Here, as shown in FIG. 16A, the upper limit of the film thickness of dielectric thin film 5 is desirably $0.5\lambda$ so that the electromechanical coupling factor of a Rayleigh wave is below a given level.

Figure 20A:
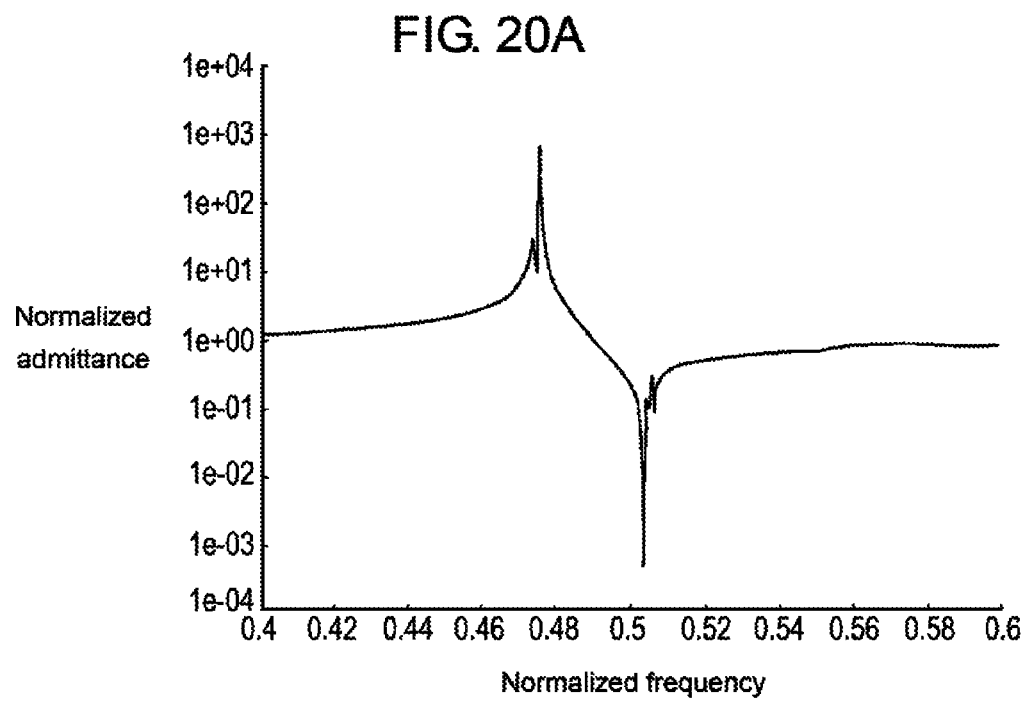
FIG. 20A illustrates the characteristics of an acoustic wave resonator according to the third exemplary embodiment of the present invention.
Figure 20B:
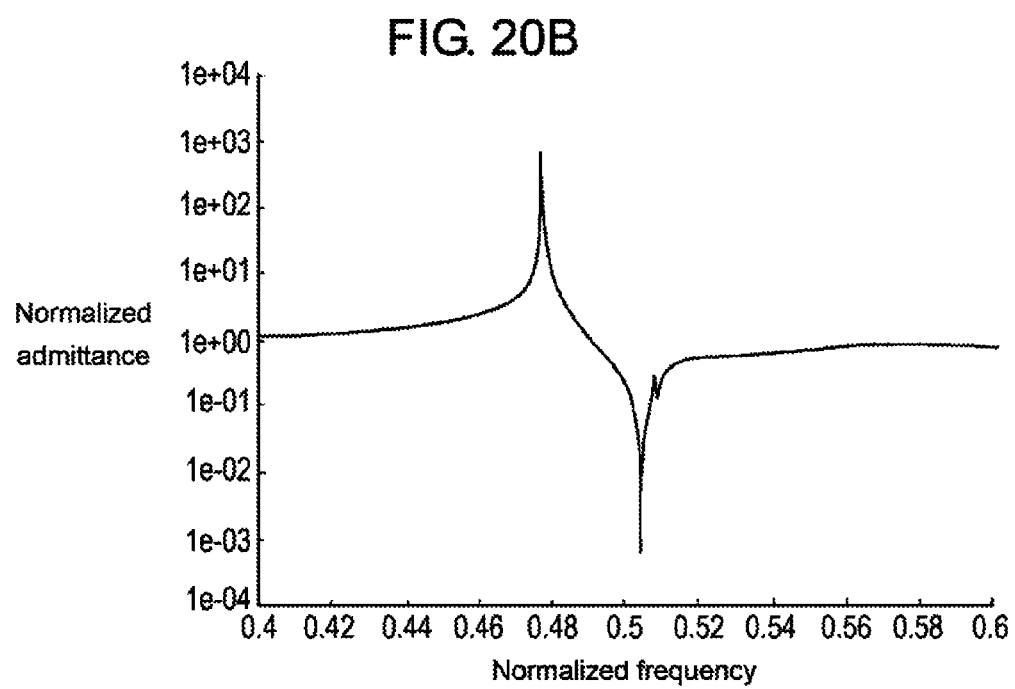
FIG. 20B illustrates the characteristics of the resonator.

FIGS. 20A and 20B are characteristic diagrams of acoustic wave resonator 1 in a case where piezoelectric body 2 is made of lithium niobate respectively having Euler angles: (7, −87.5, 8.4) and (9°, −87.5°, 10.7°); IDT electrode 3 is made of copper with a film thickness of $0.03\lambda$; and dielectric thin film 5 is made of silicon oxide with a film thickness of $0.35\lambda$ with its top surface flat above IDT cross region 8. As shown in FIGS. 20A and 20B, acoustic wave resonator 1 can prevent unnecessary spurious emission near a frequency band where a fast side wave occurs while reducing unnecessary spurious emission due to a Rayleigh wave.

Figure 21:
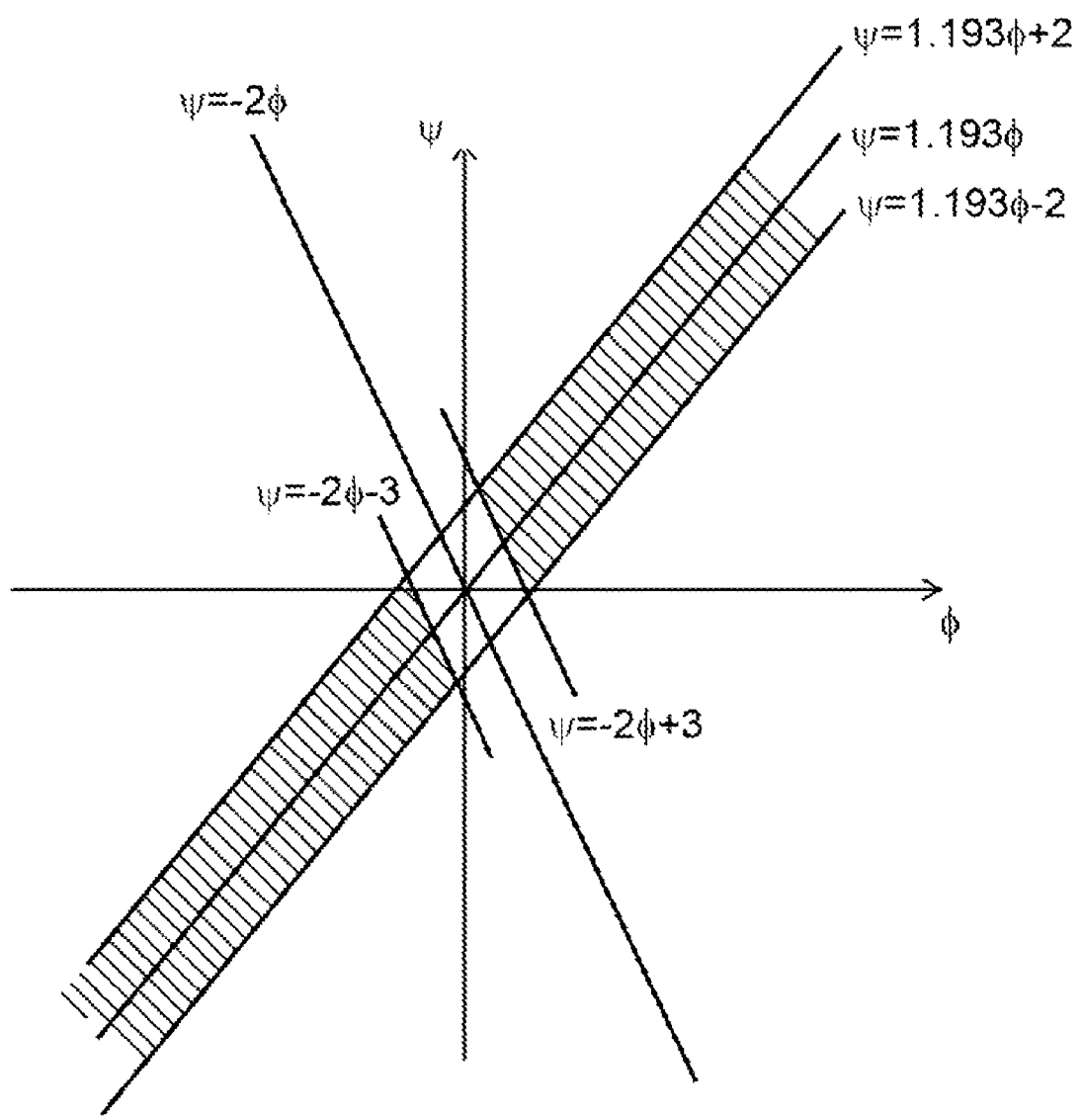
FIG. 21 illustrates the characteristics of an acoustic wave resonator according to the third exemplary embodiment of the present invention.
Figure 22:
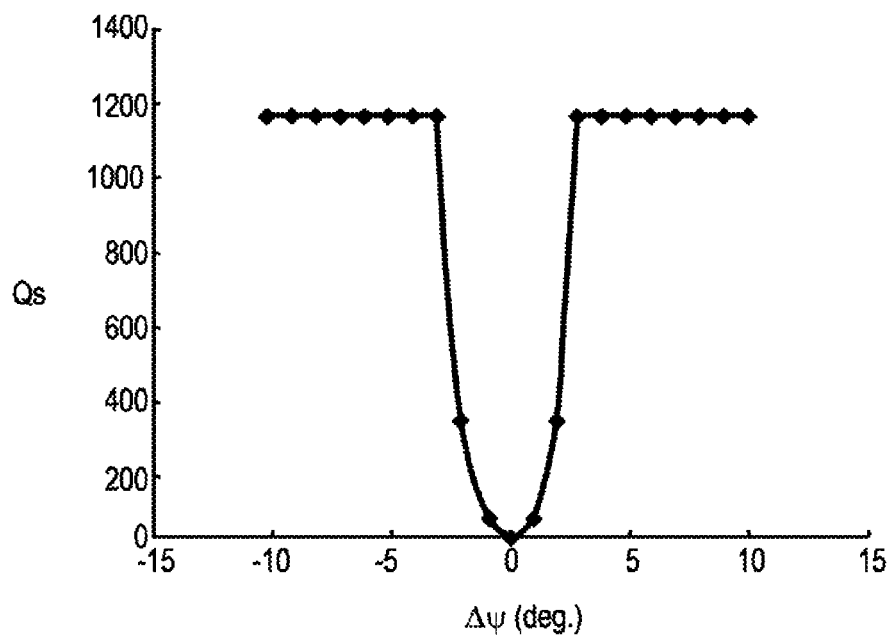
FIG. 22 illustrates the characteristics of the resonator.

FIG. 21 indicates a possible range of $\phi$ and $\psi$ of Euler angle ($\phi$, $\theta$, $\psi$) of piezoelectric body 2 based on lithium niobate, by oblique lines. Here, assumption is made that $-100° \leq \theta \leq -60°$ is satisfied; the film thickness of dielectric thin film 5 above IDT cross region 8 is thicker than $0.27\lambda$; and IDT electrode 3 is made of copper with a normalized film thickness of $0.03\lambda$. The line of $\psi=1.193\phi$ in FIG. 21 shows a relationship between $\phi$ and $\psi$ in a case where spurious emission due to a Rayleigh wave is especially reduced. In the range of $\psi \pm 2°$ (i.e. $1.193\phi-2° \leq \psi \leq 1.193\phi+2°$), spurious emission due to a Rayleigh wave is reduced. The reason is described using FIG. 22. FIG. 22 shows the Q value of a Rayleigh wave in acoustic wave resonator 1 in a case where $\psi$ of Euler angle ($\phi$, $\theta$, $\psi$) of piezoelectric body 2 is increased and decreased from $\psi=1.193\phi$ under the same conditions as the above acoustic wave resonator 1. Here, the vertical axis in FIG. 22 represents the Q value of a Rayleigh wave; the horizontal axis, variation $\Delta\psi$ of $\psi$ from $\psi=1.193\phi$. As shown in FIG. 22, the Q value of a Rayleigh wave in acoustic wave resonator 1 is reduced to below a given level in the range of $\psi=1.193\phi \pm 2°$ of Euler angle ($\phi$, $\theta$, $\psi$) of piezoelectric body 2.

Figure 23:
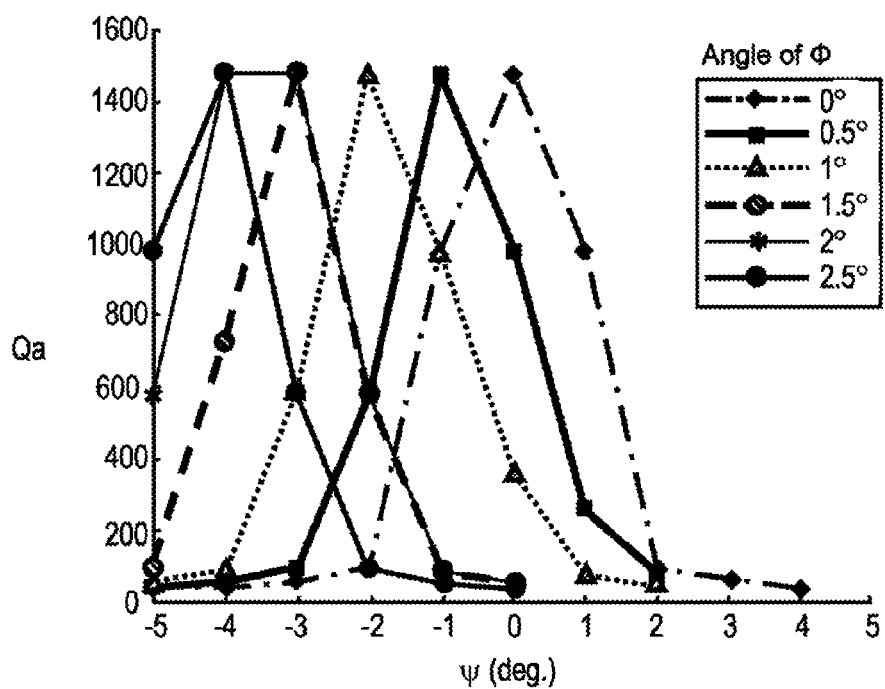
FIG. 23 illustrates the characteristics of the resonator.

The line of $\psi=-2\phi$ in FIG. 21 shows a relationship between $\phi$ and $\psi$ in a case where spurious emission due to a fast side wave occurs particularly to a large degree. In the range of $\psi \pm 3°$ (i.e. $\psi \leq -2\phi-3°$, $-2\phi+3° \leq \psi$), spurious emission due to a fast side wave is reduced. The reason is described using FIG. 23. FIG. 23 shows the Q value of a Rayleigh wave in acoustic wave resonator 1 in a case where $\psi$ of Euler angle ($\phi$, $\theta$, $\psi$) of piezoelectric body 2 is increased and decreased from $\psi=-2\phi$ ($\phi=0°$, 0.5°, 1°, 1.5°, 2°, 2.5°) under the same conditions as the above acoustic wave resonator 1. As shown in FIG. 23, the Q value of a fast side wave in acoustic wave resonator 1 is reduced to below a given level in the range of $\psi=-2\phi \pm 3°$ of Euler angle ($\phi$, $\theta$, $\psi$) of piezoelectric body 2.

Figure 24:
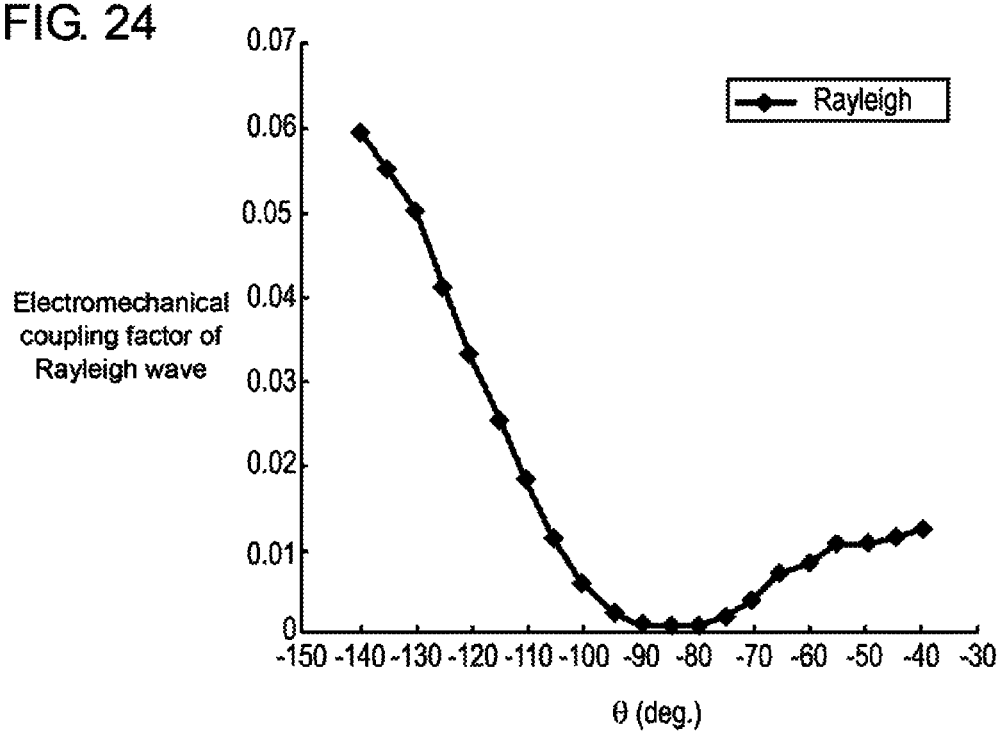
FIG. 24 illustrates the characteristics of the resonator.

FIG. 24 shows electromechanical coupling factor k2 of a Rayleigh wave in acoustic wave resonator 1 in a case where $\theta$ of Euler angle ($\phi$, $\theta$, $\psi$) of piezoelectric body 2 is changed under the same conditions as the above. As shown in FIG. 24, to reduce electromechanical coupling factor k2 of a Rayleigh wave to below 0.01, $\theta$ of Euler angle ($\phi$, $\theta$, $\psi$) of piezoelectric body 2 needs to satisfy $-100° \leq \theta \leq -60°$.

Figure 25:
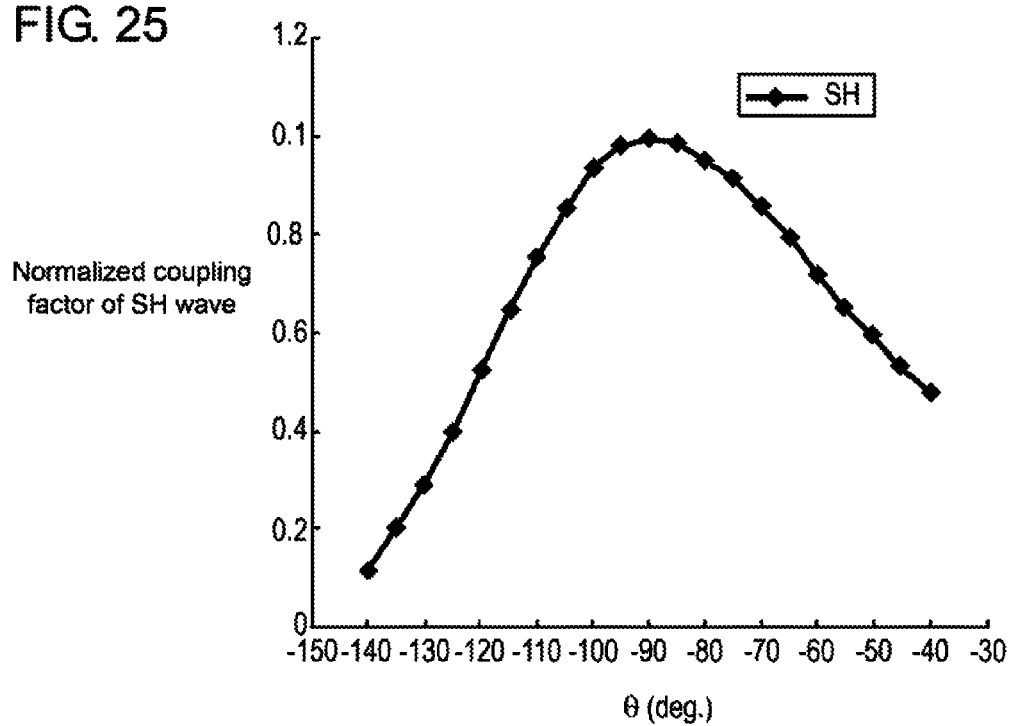
FIG. 25 illustrates the characteristics of the resonator.

FIG. 25 shows the normalized coupling factor of an SH wave in acoustic wave resonator 1 in a case where $\theta$ of Euler angle ($\phi$, $\theta$, $\psi$) of piezoelectric body 2 is changed in acoustic wave resonator 1 under the same conditions as the above. The electromechanical coupling factor in FIG. 25 is a value determined by normalizing with the electromechanical coupling factor at $\theta=-90°$. As shown in FIG. 25, electromechanical coupling factor k2 of an SH wave is higher than a given value in the range of θ of Euler angle (φ, θ, ψ) of piezoelectric body 2 satisfying −110°≤θ≤−60° (includes −100°≤θ≤−60°.

Figure 26:
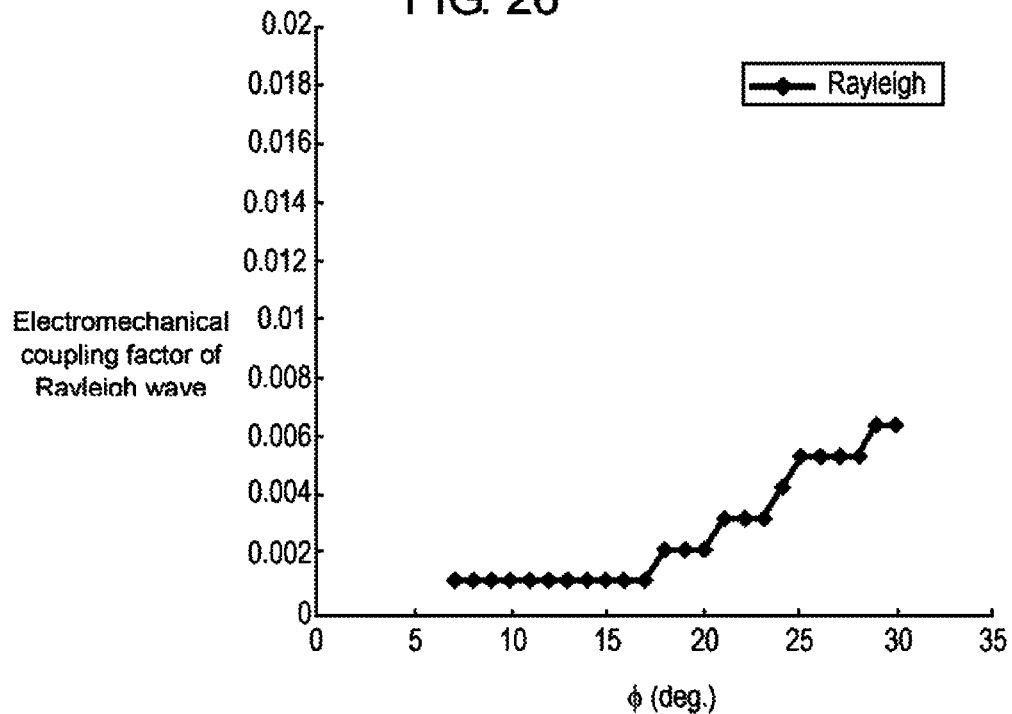
FIG. 26 illustrates the characteristics of the resonator.

FIG. 26 shows electromechanical coupling factor k2 of a Rayleigh wave in acoustic wave resonator 1 in a case where φ and ψ of Euler angle (φ, θ, ψ) of piezoelectric body 2 are changed along the line of ψ=1.193φ in acoustic wave resonator 1 under the same conditions as the above. As shown in FIG. 26, the electromechanical coupling factor of a Rayleigh wave can be reduced to below 0.002 (further lower than 0.01 described above) in the range of φ≤20°. The result is the same for a case where the Euler angle of piezoelectric body 2 is rotated in the negative direction with respect to φ. Consequently, φ of Euler angle (φ, θ, ψ) of piezoelectric body 2 desirably satisfies |φ|≤20° in acoustic wave resonator 1 under the above conditions, which further reduces the electromechanical coupling factor of a Rayleigh wave.

Figure 27:
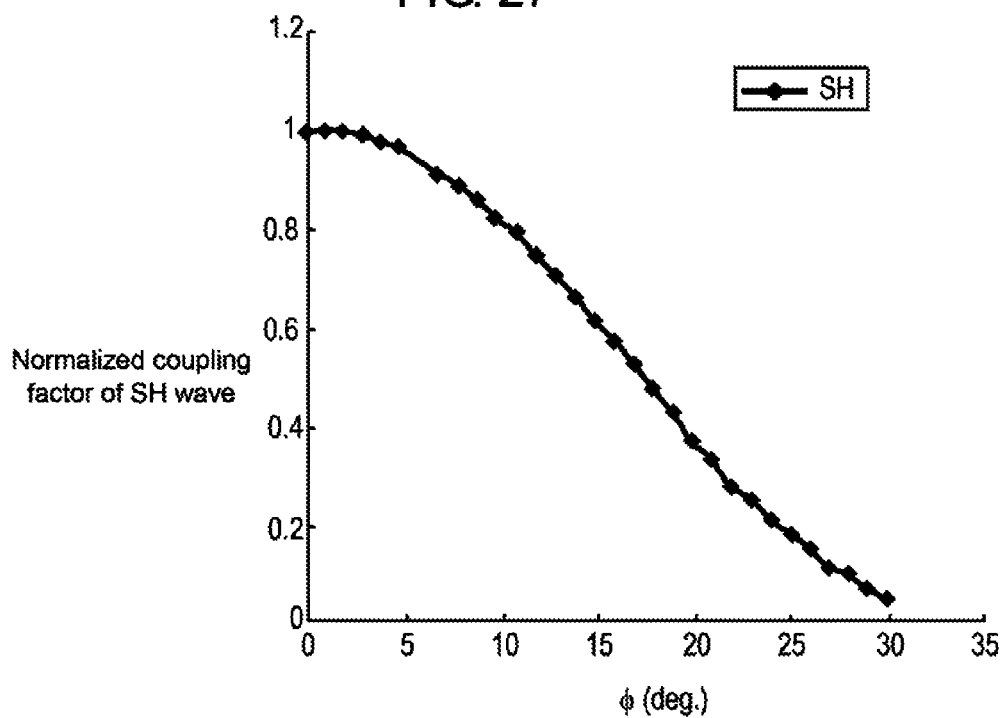
FIG. 27 illustrates the characteristics of the resonator.

FIG. 27 shows the normalized coupling factor of an SH wave in a case where φ and ψ of Euler angle (φ, θ, ψ) of piezoelectric body 2 are changed along the line of ψ=1.193φ in acoustic wave resonator 1 under the same conditions as the above. FIG. 27 shows a case where the Euler angle of piezoelectric body 2 is rotated in the positive direction with respect to φ; the result is the same for a case where the Euler angle of piezoelectric body 2 is rotated in the negative direction with respect to φ. As shown in FIG. 27, φ satisfying |φ|≤20° of Euler angle (φ, θ, ψ) of piezoelectric body 2 allows achieving the electromechanical coupling factor of an SH wave higher than a given value from the aspect of an SH wave (i.e. a main acoustic wave) as well.

The main acoustic wave described above is applicable to both of a surface acoustic wave propagating on the surface of piezoelectric body 23 and a boundary acoustic wave. For example, for a film thickness of protective film 24 of λ or greater, the above main acoustic wave is a boundary acoustic wave.

Fourth Exemplary Embodiment

Figure 28:
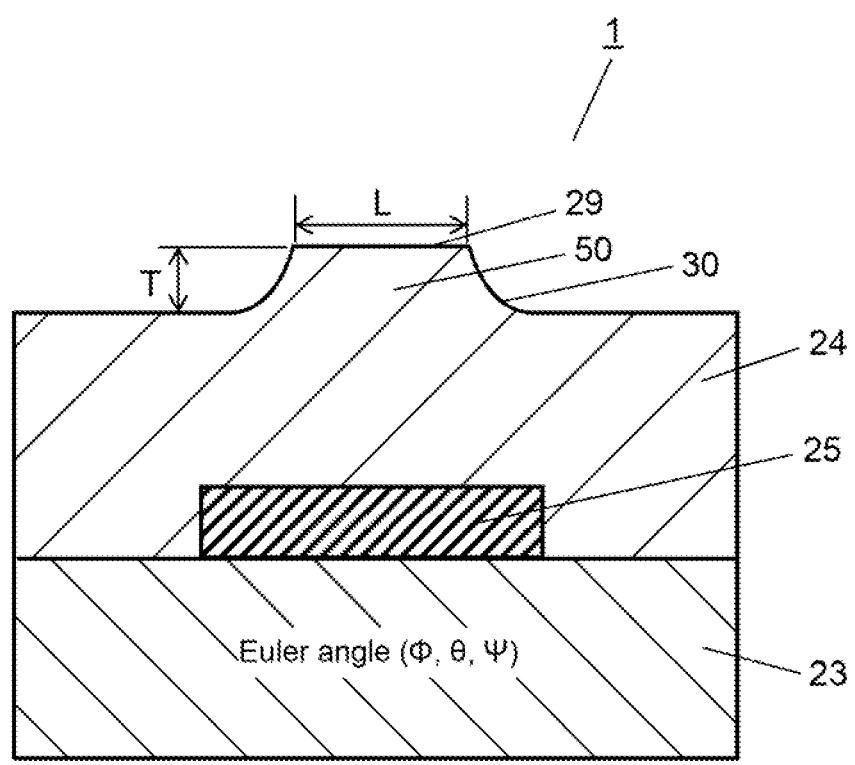
FIG. 28 is a sectional view of an acoustic wave resonator according to the fourth exemplary embodiment of the present invention.

Hereinafter, a description is made of acoustic wave resonator 1 of the fourth exemplary embodiment using the related drawings. The configuration is the same as that of the other embodiments unless particularly described. FIG. 28 is a cross sectional (a cross section of IDT cross region 8) view, taken along line 28-28 in FIG. 1A according to the first embodiment or line 28-28 in FIG. 12A according to the second embodiment.

Acoustic wave resonator 1 according to the fourth embodiment includes piezoelectric body 2 based on lithium niobate having Euler angle (φ, θ, ψ); and IDT electrode 3 provided on piezoelectric body 2, for exciting a main acoustic wave with wavelength λ. Resonator 1 further includes dielectric thin film 5 provided on piezoelectric body 2 so as to cover this IDT electrode 3, with a film thickness above IDT cross region 8 thicker than 0.2λ. This film 5 has projection 50 on a cross section orthogonal to the direction in which the electrode fingers of IDT electrode 3 extend, above the electrode fingers of IDT electrode 3. The width of top 29 of this projection 50 is smaller than that of the electrode fingers of IDT electrode 3.

The Euler angle of above-described piezoelectric body 2 satisfies −100°≤θ≤−60°, 1.193φ−2°≤ψ≤1.193φ+2°, ψ≤−2φ−3°, and −2φ+3°≤ψ.

When dielectric thin film 5 has projection 50 as in the above configuration, unnecessary spurious emission due to a fast side wave is particularly problematic. Then, for the film thickness of dielectric thin film 5 made of silicon oxide for example that is made thicker than 0.2λ above IDT cross region 8 in order to improve the frequency-temperature characteristics of acoustic wave resonator 1, when φ and ψ of Euler angle (φ, θ, ψ) of piezoelectric body 2 are changed from φ=ψ=0° while keeping φ and ψ larger than a given angle and ψ=1.193φ to some extent, unnecessary spurious emission near a frequency band where a fast side wave occurs can be prevented while unnecessary spurious emission due to a Rayleigh wave is reduced.

Figure 29A:
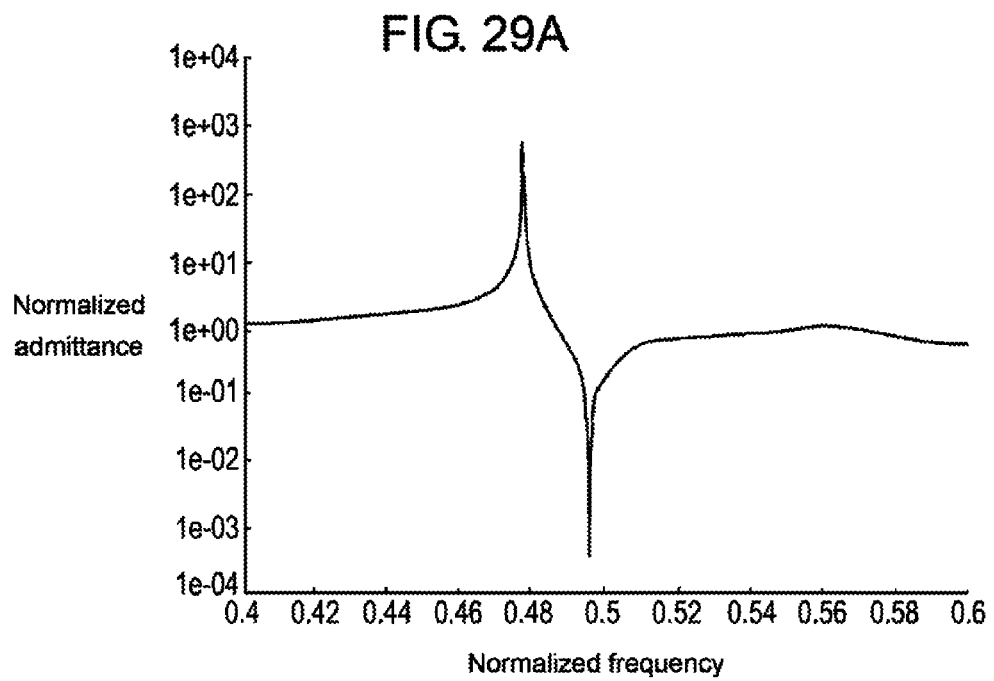
FIG. 29A illustrates the characteristics of the resonator.
Figure 29B:
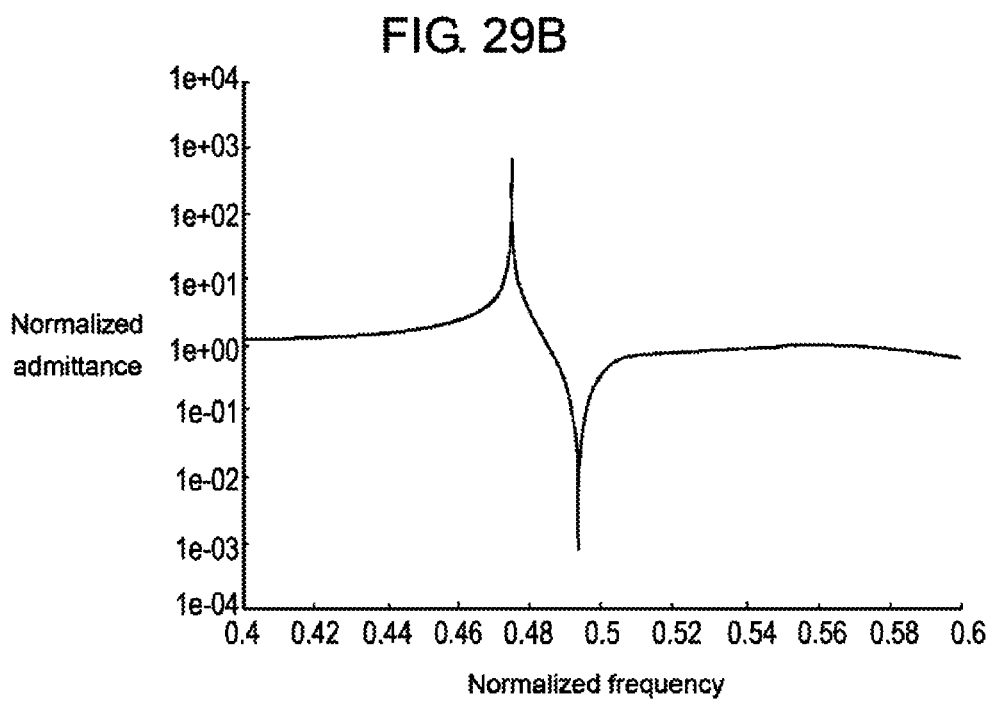
FIG. 29B illustrates the characteristics of the resonator.

FIGS. 29A and 29B are characteristic diagrams for a case where piezoelectric body 2 is made of lithium niobate respectively having Euler angles: (7, −87.5, 8.4) and (9°, −87.5°, 10.7°); IDT electrode 3 is made of aluminum with a film thickness of 0.08λ; dielectric thin film 5 is made of silicon oxide with a film thickness of 0.08λ above IDT cross region 8, with its top surface having projection 50 with height T=0.08λ. As shown in FIGS. 29A and 29B, acoustic wave resonator 1 of the embodiment can prevent unnecessary spurious emission near a frequency band where a fast side wave occurs while reducing unnecessary spurious emission due to a Rayleigh wave.

Projection 50 of dielectric thin film 5 above IDT cross region 8 desirably has a side line gradually curved outward from top 29 of projection 50 toward bottom 30. In this case, width L of top 29 is smaller than the width of the electrode fingers of IDT electrode 3, where width L is defined by the distance between the points at which the curved line (or its extension) intersects with a line parallel to the top surface of piezoelectric body 2 including top 29. This shape allows the mass addition of dielectric thin film 5 at projection 50 to be changed continuously and gradually. Consequently, the electrical characteristics of acoustic wave resonator 1 can be improved while unnecessary reflection resulting from the shape of dielectric thin film 5 is reduced.

Here, the width of top 29 of projection 50 is desirably smaller than ½ of the width of an electrode finger of IDT electrode 3. The center position of top 29 desirably coincides substantially with a point above the center position of the electrode finger. This structure further increases the reflectivity at the electrode finger owing to the mass addition effect, thereby improving the electrical characteristics of acoustic wave resonator 1.

Further, assuming that the height of projection 50 is T and the film thickness of IDT electrode 3 is h, satisfying 0.03λ<T≤h is desirable. This is because, when a relationship between height T (from bottom 30 of projection 50 of dielectric thin film 5 to top 29) and the electrical characteristics, the reflectivity of dielectric thin film 5 is found improved to a large degree for T higher than 0.03λ and the surface of film 5 made flat. Meanwhile, for T higher than film thickness h of IDT electrode 3, the manufacturing method described below further requires an additional new step for producing this dielectric thin film 5, which makes the manufacturing method troublesome.

FIGS. 30A through 30H illustrate an example of a method of manufacturing acoustic wave resonators 1 (e.g. having projection 50) according to the fourth embodiment of the present invention.

Figure 30A:
FIG. 30A is an explanatory diagram of a method of manufacturing acoustic wave resonators according to the fourth exemplary embodiment of the present invention.

First, as shown in FIG. 30A, electrode film 32 becoming IDT electrodes and/or reflectors is film-formed on the top surface of piezoelectric body 31 by deposition or sputtering for example with Al or Al alloy.

Figure 30B:
FIG. 30B is an explanatory diagram of the method.

Then, as shown in FIG. 30B, resist film 33 is formed on the top surface of electrode film 32.

Figure 30C:
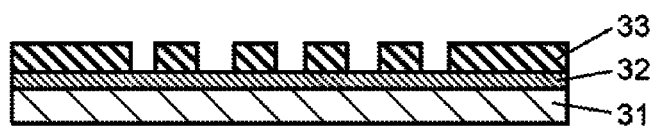
FIG. 30C is an explanatory diagram of the method.

Further, as shown in FIG. 30C, resist film 33 is processed into a desired shape by exposure and development for example.

Figure 30D:
FIG. 30D is an explanatory diagram of the method.

Furthermore, as shown in FIG. 30D, electrode film 32 is processed into a desired shape (e.g. IDT electrode, reflector) by dry etching for example, and then resist film 33 is removed.

Figure 30E:
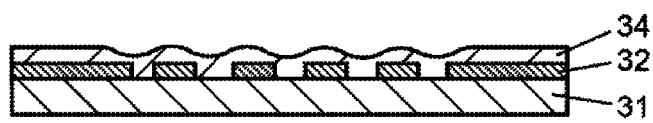
FIG. 30E is an explanatory diagram of the method.

Next, as shown in FIG. 30E, dielectric thin film 34 is formed so as to cover electrode film 32 by deposition or sputtering for example with $SiO_2$. To produce the above-described projection of dielectric thin film 34, what is called bias sputtering is used, in which a film is formed by sputtering while a bias voltage is being applied on piezoelectric body 31.

Dielectric thin film 34 is deposited on piezoelectric body 31 by sputtering a silicon oxide target, and simultaneously part of dielectric thin film 34 on piezoelectric body 31 is sputtered with a bias voltage. That is to say, part of dielectric thin film 34 is shaved while depositing film 34 to control the shape of film 34. To control the shape of dielectric thin film 34, the following means can be used. That is, the ratio of a bias voltage applied to piezoelectric body 31 to sputtering power is changed during the process of depositing dielectric thin film 34. Another means is, a film is formed without applying a bias voltage on piezoelectric body 31 in the initial period of film-forming; a bias voltage is applied simultaneously with film-forming from halfway through the process. In this case, the temperature of piezoelectric body 31 is controlled as well.

Figure 30F:
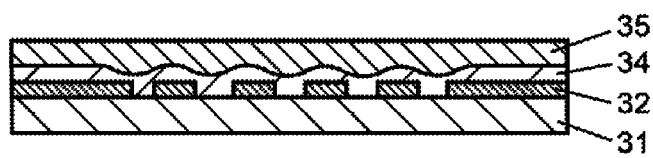
FIG. 30F is an explanatory diagram of the method.

Further, as shown in FIG. 30F, resist film 35 is formed on the front surface of dielectric thin film 34.

Figure 30G:
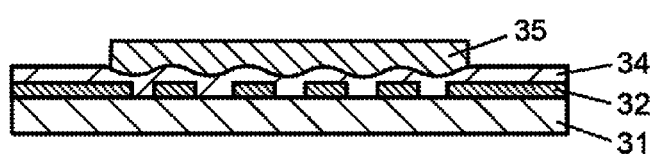
FIG. 30G is an explanatory diagram of the method.

Furthermore, as shown in FIG. 30G, resist film 35 is processed into a desired shape by exposure and development for example.

Figure 30H:
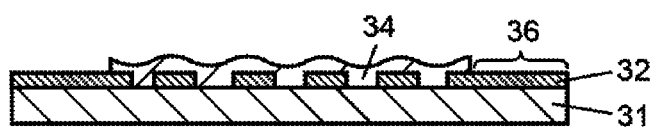
FIG. 30H is an explanatory diagram of the method.

Next, as shown in FIG. 30H, unnecessary part of dielectric thin film 34 (e.g. pad 36 for extracting an electric signal) is removed by dry etching for example, and then resist film 35 is removed.

Finally, piezoelectric body 31 is divided into pieces by dicing to produce acoustic wave resonators 1.

As described above, the inventors have confirmed that a desired shape can be achieved by film-forming dielectric thin film 34 by bias sputtering under appropriate conditions.

The characteristics of acoustic wave resonator 1 according to the fourth embodiment described above are the same as those of acoustic wave resonator 1 according to the first embodiment shown in FIGS. 21 through 27. That is, for the film thickness of dielectric thin film 5 made of silicon oxide for example that is made thicker than $0.2\lambda$ in order to improve the frequency-temperature characteristics of acoustic wave resonator 1, when $\phi$ and $\psi$ of Euler angle ($\phi$, $\theta$, $\psi$) of piezoelectric body 2 are changed from ($\phi=\psi=0°$ while keeping $\phi$ and $\psi$ larger than a given angle and $\psi=1.193\phi$ to some extent, unnecessary spurious emission near a frequency band where a fast side wave occurs can be prevented while unnecessary spurious emission due to a Rayleigh wave is reduced.

Further, acoustic wave resonator 1 of the first embodiment may be applied to a filter (e.g. a ladder-type filter or a DMS filter, not shown). Furthermore, resonator 1 may be applied to a duplexer (not shown) including a transmission filter and a reception filter. Resonator 1 may be applied to an electronic device including the filter, a semiconductor integrated circuit element (not shown) connected to the filter, and a reproducing device connected to the semiconductor integrated circuit element (not shown).

INDUSTRIAL APPLICABILITY

An acoustic wave resonator and a duplexer according to the present invention have an advantage of reducing transverse-mode spurious emission, which is applicable to an electronic device such as a mobile phone.

The invention claimed is:

1. An acoustic wave resonator comprising:
    a piezoelectric body;
    an IDT electrode on the piezoelectric body, for exciting an acoustic wave with wavelength $\lambda$; and
    a dielectric thin film covering the IDT electrode, for propagating a side wave slower than a side wave propagated through the piezoelectric body,
    wherein the IDT electrode includes a bus bar electrode region, a dummy electrode region, and an IDT cross region in an order from outside in a direction in which electrode fingers of the IDT electrode extend, and
    wherein a film thickness of the dielectric thin film above at least one of the bus bar electrode region and the dummy electrode region is smaller than a film thickness of the dielectric thin film above the IDT cross region by $0.1\lambda$ to $0.25\lambda$.

2. An acoustic wave resonator comprising:
    a piezoelectric body;
    an IDT electrode on the piezoelectric body, for exciting an acoustic wave with wavelength $\lambda$; and
    a dielectric thin film covering the IDT electrode, for propagating a side wave slower than a side wave propagated through the piezoelectric body,
    wherein the IDT electrode includes a bus bar electrode region, a gap region, and an IDT cross region in an order from outside in a direction in which electrode fingers of the IDT electrode extend, and
    wherein a film thickness of the dielectric thin film above at least one of the bus bar electrode region and the gap region is smaller than a film thickness of the dielectric thin film above the IDT cross region by $0.1\lambda$ to $0.25\lambda$.

3. The acoustic wave resonator of claim 1, wherein the film thickness of the dielectric thin film above the IDT cross region is set so that a sound velocity of an acoustic wave excited by the IDT electrode is lower than a sound velocity of a side wave propagated through the piezoelectric body.

4. The acoustic wave resonator of claim 1, wherein the IDT electrode is a normal-type, comb-shaped electrode having a cross width constant in a direction in which the acoustic wave is propagated.

5. The acoustic wave resonator of claim 1, wherein the dielectric thin film is formed of silicon oxide.

6. The acoustic wave resonator of claim 5, wherein the film thickness of the dielectric thin film above the IDT cross region is set so that a temperature characteristic of an acoustic wave excited by the IDT electrode is 10 ppm/° C. or lower.

7. The acoustic wave resonator of claim 1, wherein the film thickness of the dielectric thin film above the IDT cross region is $0.27\lambda$ to $0.5\lambda$.

8. The acoustic wave resonator of claim 1, wherein the dummy electrode region includes a metallized dummy electrode weighting part.

9. The acoustic wave resonator of claim 1,
    wherein the IDT electrode is apodized weighted so that a cross width of the IDT cross region becomes gradually narrower from a center of the IDT cross region toward an end of the IDT cross region in a direction in which the acoustic wave is propagated, and
    wherein an angle formed by a straight line connecting front ends of the electrode fingers from the center of the IDT cross region toward the end of the IDT cross region is between 4 and 10 degrees.

10. The acoustic wave resonator of claim 1,
    wherein the piezoelectric body is based on lithium niobate having Euler angle ($\phi$, $\theta$, $\psi$),
    wherein the dielectric thin film has a film thickness above the IDT cross region greater than $0.27\lambda$, and wherein the Euler angle satisfies $-100° \leq \theta \leq -60°$, $1.193\phi-2° \leq \psi \leq 1.193\phi+2°$, and $\psi \leq -2\phi-3°, -2\phi+3° \leq \psi$.

11. The acoustic wave resonator of claim 1,
wherein the piezoelectric body is based on lithium niobate having an Euler angle ($\phi, \theta, \psi$),
wherein the dielectric thin film has a film thickness above the IDT cross region greater than $0.2\lambda$,
wherein the dielectric thin film has a projection on a cross section orthogonal to a direction in which the electrode fingers of the IDT electrode extend, above the electrode fingers of the IDT electrode,
wherein a width of a top of the projection is smaller than a width of the electrode fingers of the IDT electrode, and
wherein the Euler angle satisfies $-100° \leq \theta \leq -60°$, $1.193\phi-2° \leq \psi \leq 1.193\phi+2°$, and $\psi \leq -2\phi-3°, -2\phi+3° \leq \psi$.

12. The acoustic wave resonator of claim 10, wherein the Euler angle satisfies $-20° \leq \phi \leq 20°$.

13. The acoustic wave resonator of claim 11, wherein the dielectric thin film has a shape of the cross section with a side line curved outward from the top of the projection toward a bottom of the projection.

14. The acoustic wave resonator of claim 11, wherein the width of the top of the projection is smaller than ½ of the width of an electrode finger of the IDT electrode.

15. The acoustic wave resonator of claim 11, wherein a center position of the top of the projection coincides substantially with a point above a center position of the electrode finger.

16. The acoustic wave resonator of claim 11, wherein $0.03\lambda < T \leq h$ is satisfied, assuming that T is a height of the projection and h is a film thickness of the IDT electrode.

17. A duplexer having a transmission filter and a reception filter, wherein the transmission filter or the reception filter includes the acoustic wave resonator of claim 1.

18. The acoustic wave resonator of claim 2, wherein the film thickness of the dielectric thin film above the IDT cross region is set so that a sound velocity of an acoustic wave excited by the IDT electrode is lower than a sound velocity of a side wave propagated through the piezoelectric body.

19. The acoustic wave resonator of claim 2, wherein the IDT electrode is a normal-type, comb-shaped electrode having a cross width constant in a direction in which the acoustic wave is propagated.

20. The acoustic wave resonator of claim 2, wherein the dielectric thin film is formed of silicon oxide.

21. The acoustic wave resonator of claim 2, wherein the film thickness of the dielectric thin film above the IDT cross region is $0.27\lambda$ to $0.5\lambda$.

22. The acoustic wave resonator of claim 2, wherein the dummy electrode region includes a metallized dummy electrode weighting part.

23. The acoustic wave resonator of claim 2,
wherein the IDT electrode is apodized weighted so that a cross width of the IDT cross region becomes gradually narrower from a center of the IDT cross region toward an end of the IDT cross region in a direction in which the acoustic wave is propagated, and
wherein an angle formed by a straight line connecting front ends of the electrode fingers from the center of the IDT cross region toward the end of the IDT cross region is between 4 and 10 degrees.

24. The acoustic wave resonator of claim 2,
wherein the piezoelectric body is based on lithium niobate having Euler angle ($\phi, \theta, \psi$),
wherein the dielectric thin film has a film thickness above the IDT cross region greater than $0.27\lambda$, and
wherein the Euler angle satisfies $-100° \leq \theta \leq -60°$, $1.193\phi-2° \leq \psi \leq 1.193\phi+2°$, and $\psi \leq -2\phi-3°, -2\phi+3° \leq \psi$.

25. The acoustic wave resonator of claim 2,
wherein the piezoelectric body is based on lithium niobate having an Euler angle ($\phi, \theta, \psi$),
wherein the dielectric thin film has a film thickness above the IDT cross region greater than $0.2\lambda$,
wherein the dielectric thin film has a projection on a cross section orthogonal to a direction in which the electrode fingers of the IDT electrode extend, above the electrode fingers of the IDT electrode,
wherein a width of a top of the projection is smaller than a width of the electrode fingers of the IDT electrode, and
wherein the Euler angle satisfies $-100° \leq \theta \leq -60°$, $1.193\phi-2° \leq \psi \leq 1.193\phi+2°$, and $\psi \leq -2\phi-3°, -2\phi+3° \leq \psi$.

26. The acoustic wave resonator of claim 11, wherein the Euler angle satisfies $-20° \leq \phi \leq 20°$.

* * * * *